(12) United States Patent
Sandhu et al.

(10) Patent No.: US 8,637,113 B2
(45) Date of Patent: Jan. 28, 2014

(54) METHODS OF FORMING A NON-VOLATILE RESISTIVE OXIDE MEMORY ARRAY

(75) Inventors: Gurtej Sandhu, Boise, ID (US); John Smythe, Boise, ID (US); Bhaskar Srinivasan, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 196 days.

(21) Appl. No.: 13/354,163

(22) Filed: Jan. 19, 2012

(65) Prior Publication Data
US 2012/0122292 A1   May 17, 2012

Related U.S. Application Data

(63) Continuation of application No. 12/141,559, filed on Jun. 18, 2008, now Pat. No. 8,114,468.

(51) Int. Cl.
| | |
|---|---|
| *C23C 18/00* | (2006.01) |
| *C23C 20/00* | (2006.01) |
| *C23C 28/00* | (2006.01) |
| *C23C 30/00* | (2006.01) |
| *H01C 17/06* | (2006.01) |

(52) U.S. Cl.
USPC ..... 427/98.4; 427/97.7; 427/98.8; 427/126.3; 257/4; 257/40; 257/489; 257/E21.495; 257/E21.007; 257/E21.242; 438/104; 438/478; 438/947; 365/148

(58) Field of Classification Search
USPC ........................ 427/97.7, 98.4, 98.8
See application file for complete search history.

(56) References Cited

U.S. PATENT DOCUMENTS

| | | | |
|---|---|---|---|
| 5,122,223 A | 6/1992 | Geis et al. | |
| 6,566,248 B1 | 5/2003 | Wang et al. | |
| 6,693,821 B2 | 2/2004 | Hsu et al. | |
| 6,933,527 B2 | 8/2005 | Isobe et al. | |
| 6,972,211 B2 | 12/2005 | Hsu et al. | |
| 7,045,851 B2 | 5/2006 | Black et al. | |
| 7,193,267 B2 | 3/2007 | Hsu et al. | |
| 7,312,473 B2 | 12/2007 | Koyama et al. | |
| 7,687,793 B2 | 3/2010 | Harshfield et al. | |
| 7,732,533 B2 | 6/2010 | Millward et al. | |
| 7,964,107 B2 | 6/2011 | Millward | |
| 2002/0012745 A1 | 1/2002 | Kanamori | |
| 2004/0124092 A1 | 7/2004 | Black et al. | |
| 2004/0142578 A1 | 7/2004 | Wiesner et al. | |

(Continued)

OTHER PUBLICATIONS

Black et al., "Polymer self assembly in semiconductor microelectronics", IBM Journal of Research and Development, pp. 1-27, Sep. 2007.

(Continued)

*Primary Examiner* — Benjamin Schiffman
(74) *Attorney, Agent, or Firm* — Wells St. John, P.S.

(57) ABSTRACT

A method of forming a non-volatile resistive oxide memory array includes forming a plurality of one of conductive word lines or conductive bit lines over a substrate. Metal oxide-comprising material is formed over the plurality of said one of the word lines or bit lines. A series of elongated trenches is provided over the plurality of said one of the word lines or bit lines. A plurality of self-assembled block copolymer lines is formed within individual of the trenches in registered alignment with and between the trench sidewalls. A plurality of the other of conductive word lines or conductive bit lines is provided from said plurality of self-assembled block copolymer lines to form individually programmable junctions comprising said metal oxide-comprising material where the word lines and bit lines cross one another.

36 Claims, 22 Drawing Sheets

(56) References Cited

U.S. PATENT DOCUMENTS

| | | |
|---|---|---|
| 2006/0035451 A1 | 2/2006 | Hsu |
| 2006/0134556 A1 | 6/2006 | Nealey et al. |
| 2006/0163646 A1 | 7/2006 | Black et al. |
| 2006/0171200 A1 | 8/2006 | Rinerson et al. |
| 2006/0249784 A1 | 11/2006 | Black et al. |
| 2006/0284242 A1 | 12/2006 | Jo |
| 2007/0045615 A1 | 3/2007 | Cho et al. |
| 2007/0173019 A1 | 7/2007 | Ho et al. |
| 2007/0175859 A1 | 8/2007 | Black et al. |
| 2007/0224770 A1 | 9/2007 | Nagashima |
| 2008/0014750 A1 | 1/2008 | Nagashima |
| 2008/0026547 A1 | 1/2008 | Yin et al. |
| 2008/0073635 A1 | 3/2008 | Kiyotoshi et al. |
| 2008/0085601 A1 | 4/2008 | Park et al. |
| 2008/0176767 A1 | 7/2008 | Millward |
| 2008/0217292 A1 | 9/2008 | Millward et al. |
| 2008/0247219 A1 | 10/2008 | Choi et al. |
| 2008/0311347 A1 | 12/2008 | Millward et al. |
| 2009/0092749 A1 | 4/2009 | Tachibana et al. |
| 2009/0250681 A1 | 10/2009 | Smythe et al. |
| 2009/0272960 A1 | 11/2009 | Srinivasan et al. |
| 2009/0317540 A1 | 12/2009 | Sandhu et al. |
| 2010/0003782 A1 | 1/2010 | Sinha et al. |
| 2010/0124826 A1 | 5/2010 | Millward et al. |
| 2010/0316849 A1 | 12/2010 | Millward et al. |
| 2011/0193044 A1 | 8/2011 | Sandhu et al. |

OTHER PUBLICATIONS

Chai et al., "Assembly of aligned linear metallic patterns on silicon", Nature Nanotechnology, vol. 2., Aug. 2007, pp. 500-506.

Glass et al., "Block copolymer micelle nanolithography", Nanotechnology 14 (2003) pp. 1153-1160.

Hammond et al., "Edge Effects on Thermal Disorder in Laterally Confined Diblock Copolymer Cylinder Monolayers", American Chemical Society, 2006, pp. 1538-1544.

Hawker et al., "Block Copolymer Lithography: Merging "Bottom-Up" with "Top-Down" Processes", MRS Bulletin, vol. 30, Dec. 2005, pp. 952-966.

Jaramillo et al., "Catalytic Activity of Supported Au Nanoparticles Deposited from Block Copolymer Micelles" American Chemical Society, vol. 125, No. 24, 2003, pp. 7148-7149.

Nie et al., "Self-assembly of metal-polymer analogues of amphiphilic triblock copolymers", Nature Publishing Group, 2007, pp. 1-6.

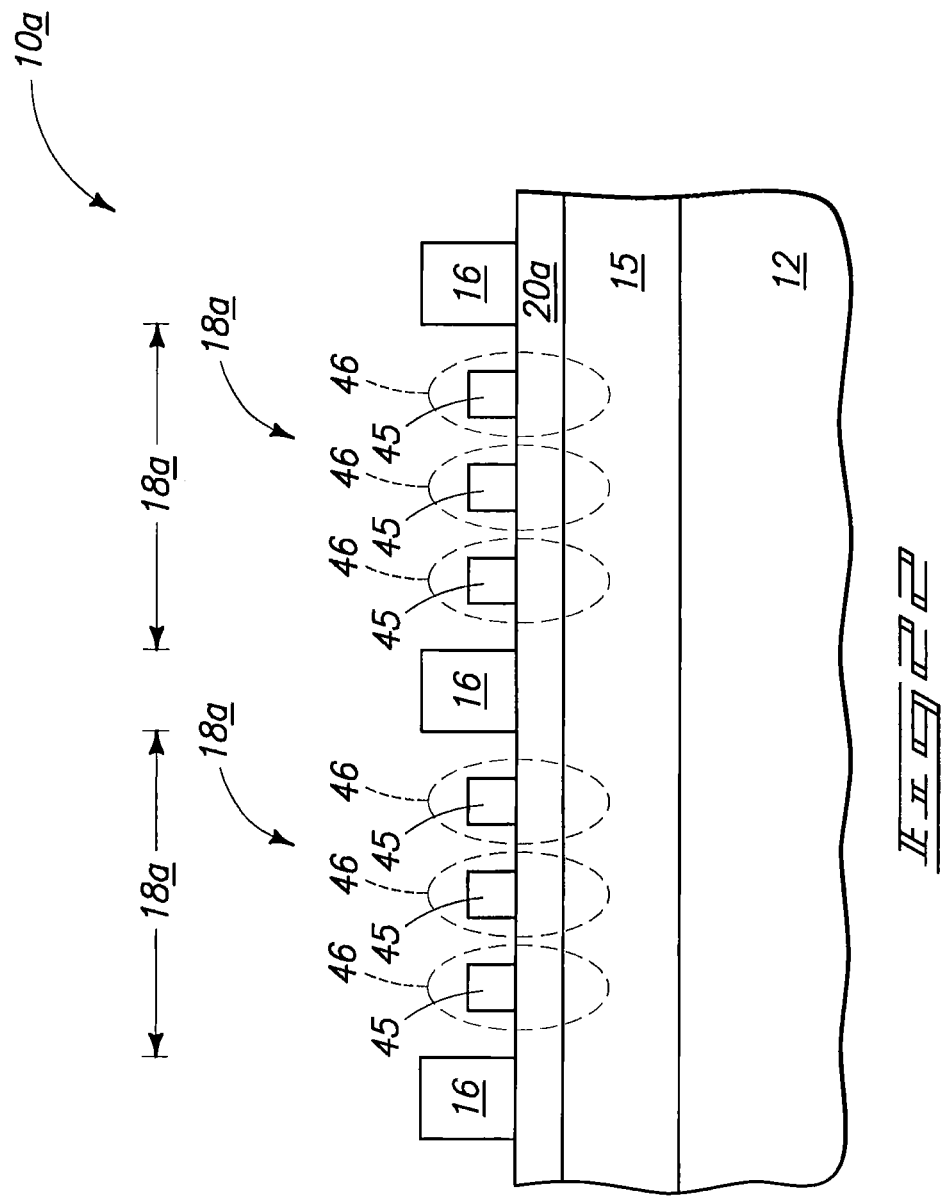

METHODS OF FORMING A NON-VOLATILE RESISTIVE OXIDE MEMORY ARRAY

RELATED PARENT DATA

This patent resulted from a continuation application of U.S. patent application Ser. No. 12/141,559, filed Jun. 18, 2008, entitled "Methods Of Forming A Non-Volatile Resistive Oxide Memory Array", naming Gurtej Sandhu, John Smythe and Bhaskar Srinivasan as inventors, the disclosure of which is incorporated by reference.

TECHNICAL FIELD

Embodiments disclosed herein pertain to methods of forming a non-volatile resistive oxide memory array.

BACKGROUND

Memory is one type of integrated circuitry, and is used in computer systems for storing data. Such is typically fabricated in one or more arrays of individual memory cells. The memory cells might be volatile, semi-volatile, or non-volatile. Non-volatile memory cells can store data for extended periods of time, and in many instances including when the computer is turned off. Volatile memory dissipates and therefore requires to be refreshed/rewritten, and in many instances including multiple times per second. Regardless, the smallest unit in each array is termed as a memory cell and is configured to retain or store memory in at least two different selectable states. In a binary system, the storage conditions are considered as either a "0" or a "1". Further, some individual memory cells can be configured to store more than two levels of information.

Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two conductive electrodes having a programmable material received there-between. Example materials include metal oxides which may or may not be homogenous, and may or may not contain other materials therewith. Regardless, the collective material received between the two electrodes is selected or designed to be configured in a selected one of at least two different resistive states to enable storing of information by an individual memory cell. When configured in one extreme of the resistive states, the material may have a high resistance to electrical current. In contrast in the other extreme, when configured in another resistive state, the material may have a low resistance to electrical current. Existing and yet-to-be developed memory cells might also be configured to have one or more additional possible stable resistive states in between a highest and a lowest resistance state. Regardless, the resistive state in which the programmable material is configured may be changed using electrical signals. For example, if the material is in a high-resistance state, the material may be configured to be in a low resistance state by applying a voltage across the material.

The programmed resistive state is designed to be persistent in non-volatile memory. For example, once configured in a resistive state, the material stays in such resistive state even if neither a current nor a voltage is applied to the material. Further, the configuration of the material may be repeatedly changed from one resistance state to another for programming the memory cell into different of at least two resistive states. Upon such programming, the resistive state of the material can be determined by appropriate signals applied to one or both of the two electrodes between which the material is received.

Certain metal oxides can be used as such materials in resistive memory cells. During fabrication, the materials which make up the memory elements are deposited and patterned to produce a desired finished shape and construction of the individual memory cells in an array of such cells. Accordingly, a conductive material is deposited for one of the electrodes, followed by deposition of at least some metal oxide for the programmable region, and followed by deposition of more conductive material for the other electrode of the memory cell. Often, the first and second conductive layers are fabricated as elongated conductive lines which run generally parallel an outermost major surface of the substrate upon which such are fabricated, yet generally orthogonal relative to one another.

Regardless, the three different regions of the memory cell are often patterned by etching using multiple masking and etching steps. Such typically include anisotropic plasma etching through the conductive outer electrode material inwardly at least to the metal oxide which will be the programmable region of the memory cell. Further, usually subsequent plasma etching is conducted through the metal oxide to the lower electrode conductive material. Also, the metal oxide may be exposed to plasma-based post-etch cleans. Regardless, exposure of the metal oxide material to plasma etching can adversely affect the operation of the memory cell in that composition and/or structure of the metal oxide material may be modified in an unpredictable manner.

BRIEF DESCRIPTION OF THE DRAWINGS

FIG. 13 is a cross sectional view of the FIG. 12 substrate fragment comprising a planar cross section taken through line 13-13 in FIG. 12.

FIG. 22 is a cross sectional view of the FIG. 21 substrate fragment comprising a planar cross section taken through line 22-22 in FIG. 21.

DETAILED DESCRIPTION OF EXAMPLE EMBODIMENTS

Figure 1:
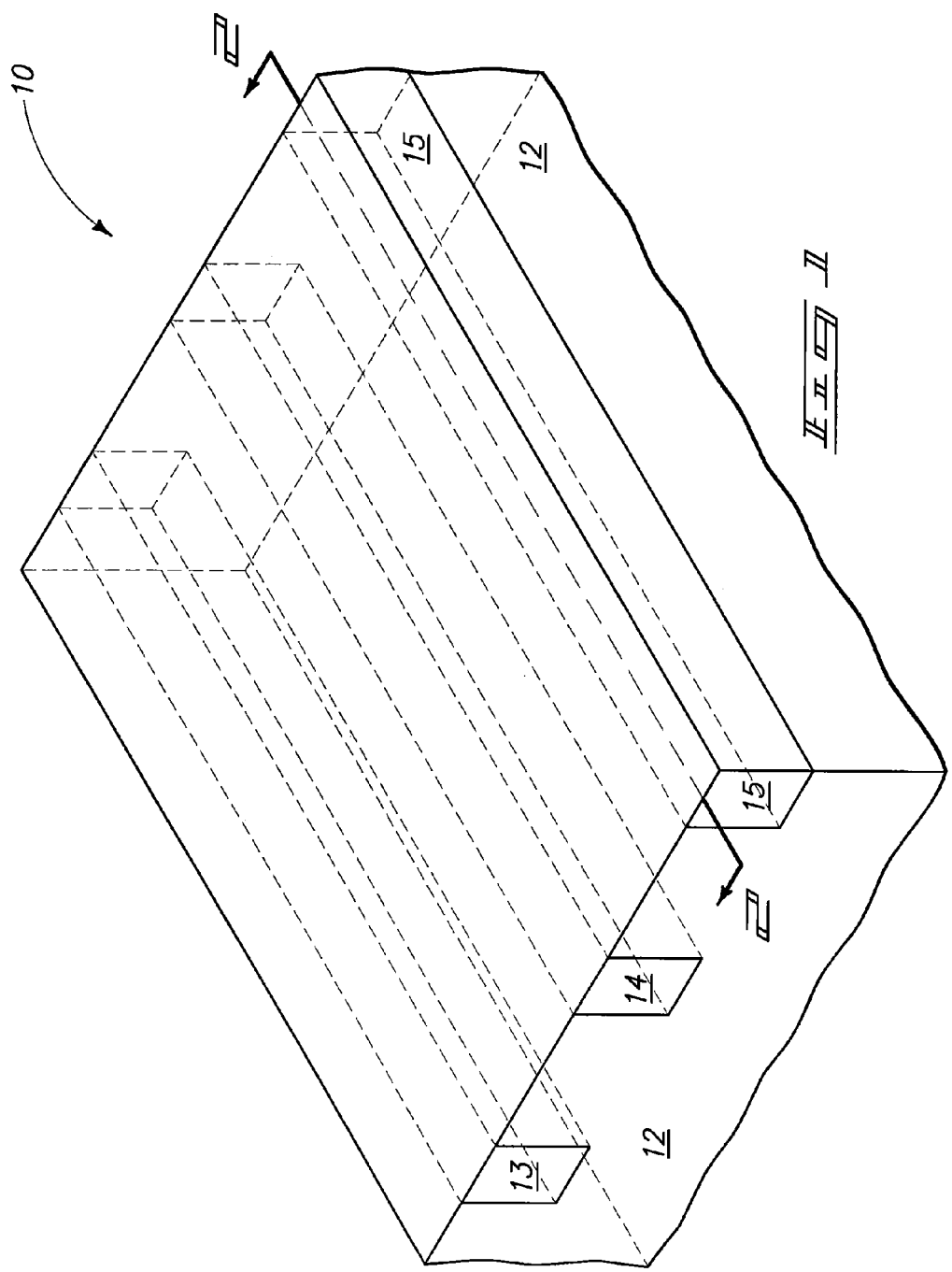
FIG. 1 is a diagrammatic isometric view of a semiconductor substrate fragment in process in accordance with an embodiment of the invention.
Figure 2:
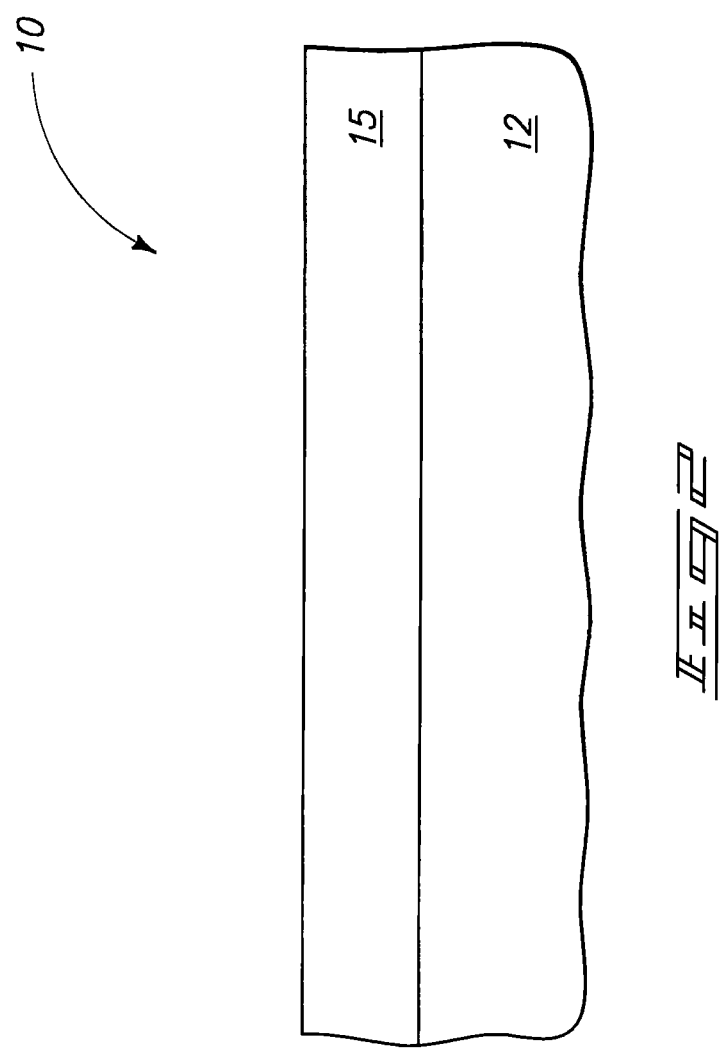
FIG. 2 is a cross sectional view of the FIG. 1 substrate fragment comprising a planar cross section taken through line 2-2 in FIG. 1.

Example embodiments of forming a non-volatile resistive oxide memory array are initially described with reference to FIGS. 1-13. Referring initially to FIGS. 1 and 2, a substrate, for example a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate fragment 10 comprises material 12 over which a series of conductive lines 13, 14 and 15 has been fabricated. Multiple different materials and layers would likely be present at least below material 12, and may for example comprise bulk semiconductor processing, semiconductor-on-insulator processing, or other substrates in process and whether existing or yet-to-be developed. In one example, material 12 is insulative, for example doped and/or undoped silicon dioxide. Insulative material 12 is also shown as being received between conductive lines 13, 14 and 15. Conductive lines 13, 14 and 15 may be comprised of one or more conductive materials and/or layers, including conductively doped semiconductive material.

Portions of each of conductive lines 13, 14 and 15 will comprise a first conductive electrode of a memory cell which will be fabricated. A plurality of non-volatile resistive oxide memory cells may be fabricated within a memory array, thereby for example perhaps millions of such individual memory cells being fabricated at essentially the same time. Further, each of conductive lines 13, 14 and 15 may constitute a first conductive electrode of multiple different memory cells, as will be apparent in the continuing discussion. Conductive lines 13, 14 and 15 comprise an example of a plurality of one of conductive word lines or conductive bit lines which have been formed over a substrate. In other words, each of the depicted conductive lines 13, 14 and 15 will comprise conductive word lines or each of conductive lines 13, 14 and 15 will comprise conductive bit lines. In the depicted and but one example embodiment, the lines 13, 14 and 15 run in respective straight lines within the array, although other configurations are of course contemplated.

Figure 3:
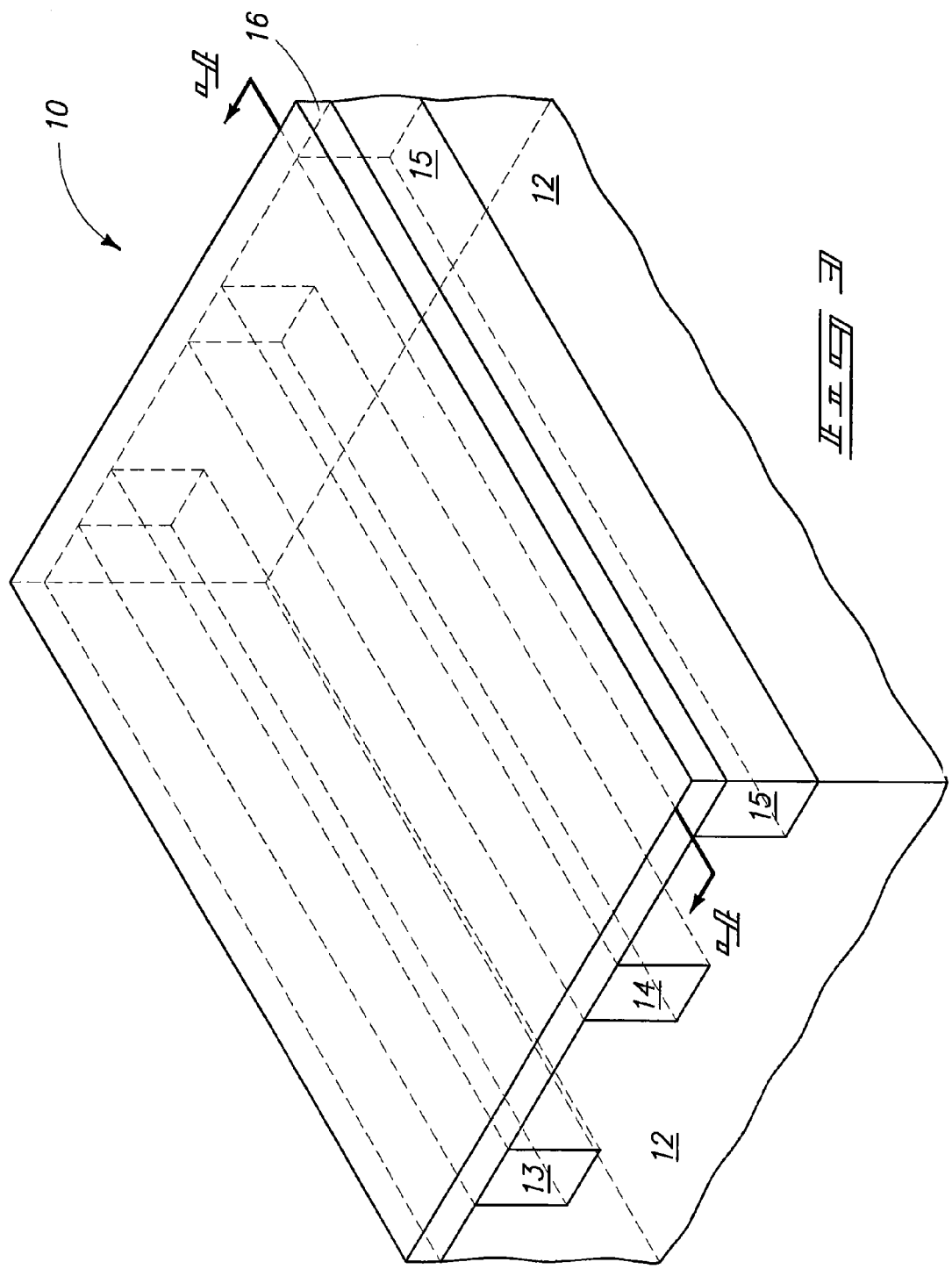
FIG. 3 is a view of the FIG. 1 substrate fragment at a processing step subsequent to that shown by FIG. 1.
Figure 4:
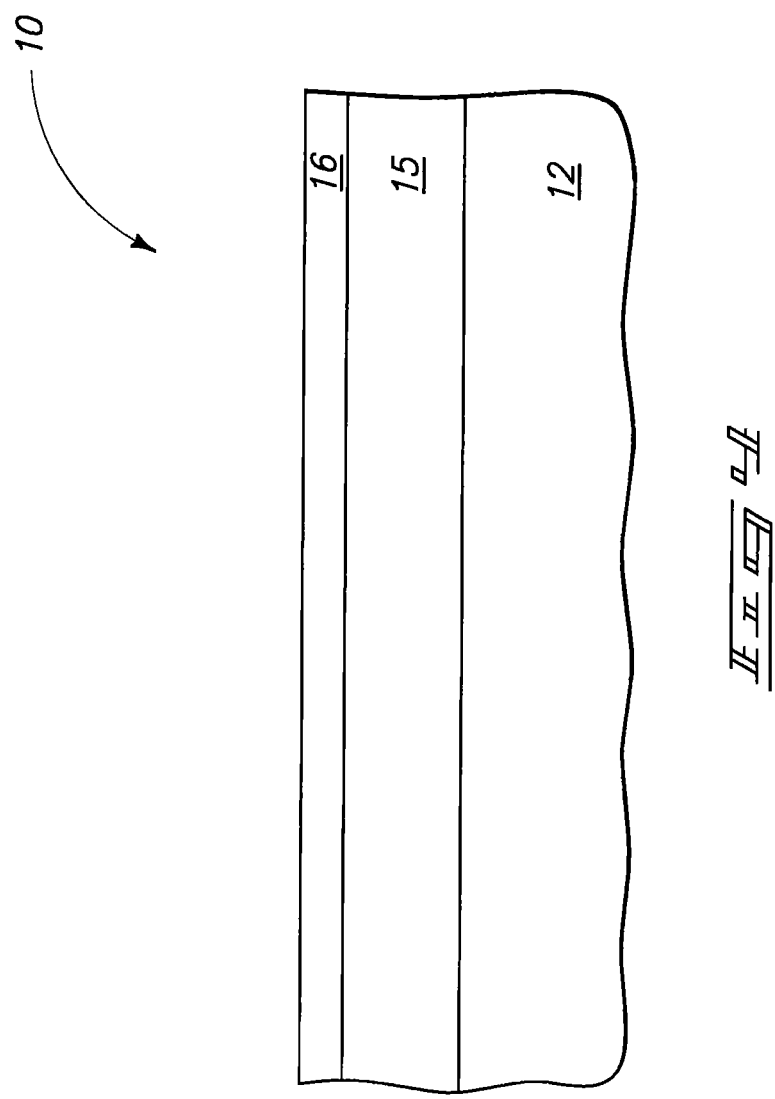
FIG. 4 is a cross sectional view of the FIG. 3 substrate fragment comprising a planar cross section taken through line 4-4 in FIG. 3.

Referring to FIGS. 3 and 4, a material 16 has been deposited over the plurality of the one of word lines 13, 14, 15 or bit lines 13, 14, 15. A series of elongated trenches will be formed within and/or through deposited material 16. Some of deposited material 16 may remain in a finished circuitry construction incorporating the memory array, or all of such may ultimately be removed. Regardless, deposited material 16 may be any of semiconductive, insulative, or conductive (including conductively doped semiconductive material). Deposited material 16 may be homogenous, non-homogenous, and/or comprise multiple different composition materials and/or layers. Example insulative materials include silicon oxides, silicon nitride, amorphous carbon, and photoresist. An example semiconductive material is polysilicon, whether doped or undoped. Example conductive materials include conductively doped polysilicon and titanium nitride.

For purposes of the continuing discussion, material 16 can be considered as having an outermost surface. Such is depicted as being planar, for example conducting a planarizing process to material 16 after its deposition if it is deposited over a non-planar surface, although the outermost surface of material 16 may or may not be planar now or at any time during fabrication. Regardless, substrate 10 at its largest or global scale can be considered as having some outer major surface that can be considered on average as defining some general horizontal plane relative to which the various layers and circuitry components are fabricated. Such outer major surface of the substrate may, of course, be comprised of more than one composition at different points in processing of the substrate. Further, the outer major surface of the substrate can be considered as averaging to be planar throughout fabrication, with such general plane rising and lowering as the circuitry is fabricated.

Figure 5:
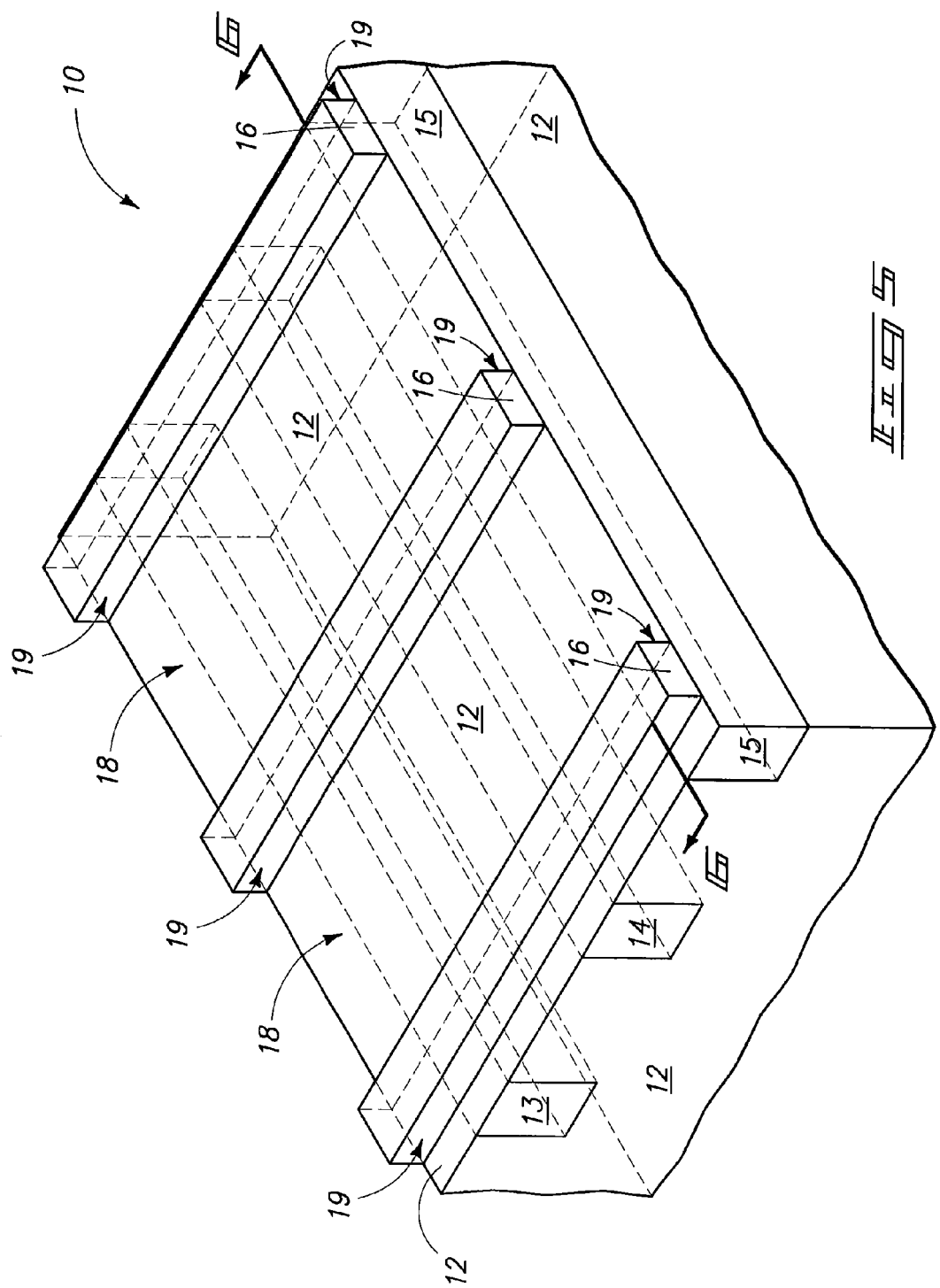
FIG. 5 is a view of the FIG. 3 substrate fragment at a processing step subsequent to that shown by FIG. 3.
Figure 6:
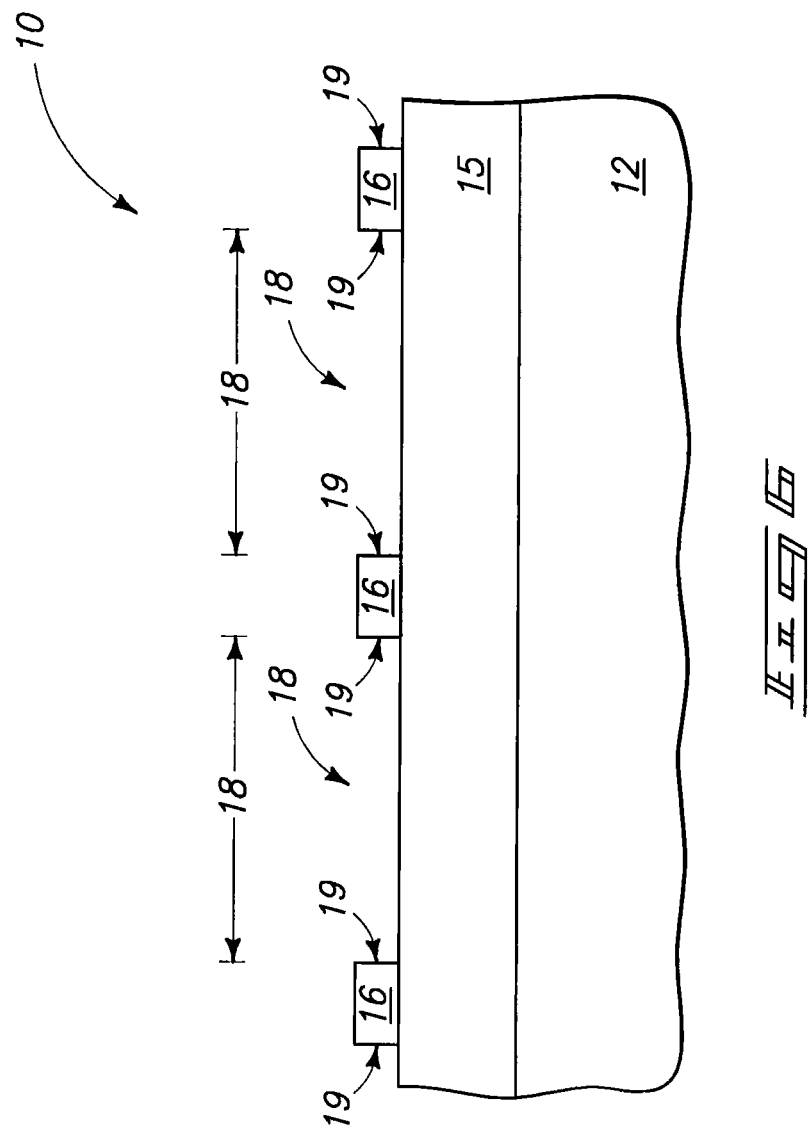
FIG. 6 is a cross sectional view of the FIG. 5 substrate fragment comprising a planar cross section taken through line 6-6 in FIG. 5.

Referring to FIGS. 5 and 6, a series of elongated trenches has been formed with deposited material 16. In the depicted embodiment, trenches 18 have been formed through deposited material 16 to the plurality of conductive word lines 13, 14, 15 or conductive bit lines 13, 14, 15, and to insulative material 12. Regardless and for purposes of the continuing discussion, trenches 18 can be considered as respectively comprising sidewalls 19. An example manner of forming trenches 18 comprises lithographic patterning and subtractive etch, for example utilizing photoresist along with transparent carbon or other material as a hard mask, followed by removal of the same. Further or alternately, and by way of example only, material 16 may be fabricated by sub-lithographic methods using spacer etching, and/or by block copolymer methods. Elongated trenches 18 run generally parallel to the outer major surface of the substrate. Further, trenches 18 are angled relative to the plurality of the one of word lines 13, 14, 15 or bit lines 13, 14, 15. In the depicted embodiment, trenches 18 both run in respective straight lines within the depicted portion of the memory array, and are angled generally perpendicular relative to the one of word lines 13, 14, 15 or bit lines 13, 14, 15. Other angles, as well as curved or other oriented trenches and bit lines/word lines, are also of course contemplated. For example, the memory array might be fabricated such that the bit lines, word lines and or trenches serpentine relative to one another in different straight line or curved-line segments throughout the array.

Figure 7:
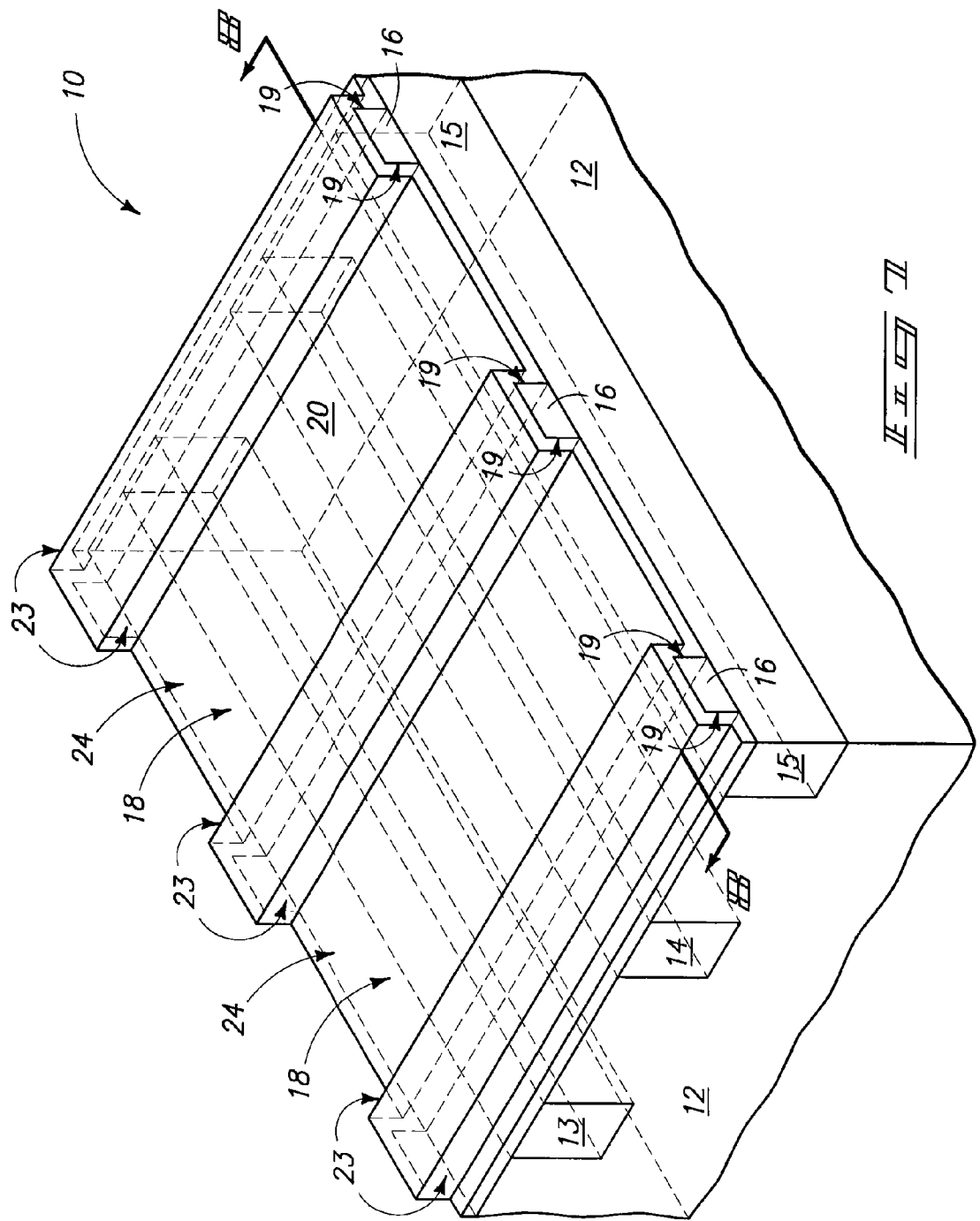
FIG. 7 is a view of the FIG. 5 substrate fragment at a processing step subsequent to that shown by FIG. 5.
Figure 8B:
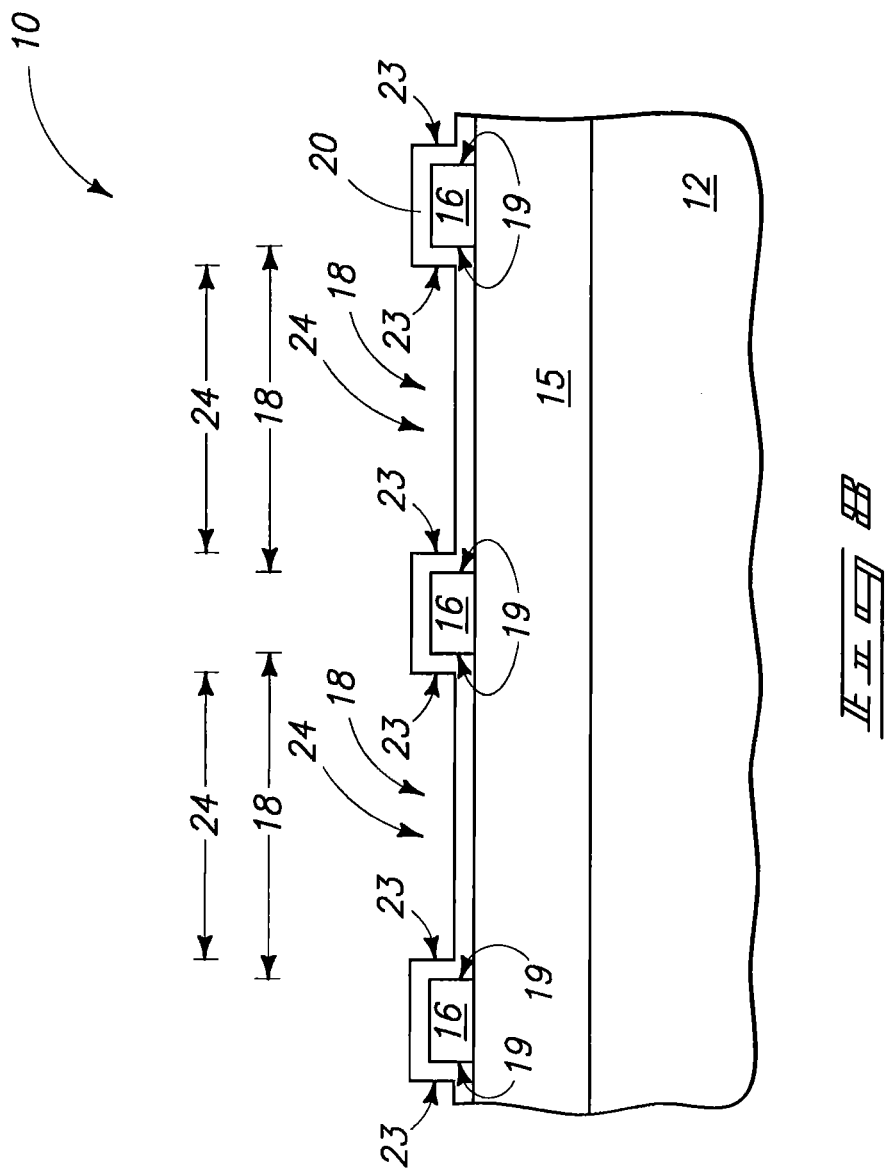
FIG. 8 is a cross sectional view of the FIG. 7 substrate fragment comprising a planar cross section taken through line 8-8 in FIG. 7.

Referring to FIGS. 7 and 8, metal oxide-comprising material 20 has been formed over the plurality of the one of word lines 13, 14, 15 or bit lines 13, 14, 15 and within and to less than completely fill trenches 18. In the example embodiment, metal oxide-comprising material 20 is depicted as being formed on lines 13, 14, 15, with "on" in this document defining some direct physical touching contact therewith. Regardless, layer 20 may be homogenous or non-homogenous, and may comprise one or more different compositions and/or layers. Accordingly, the material of layer 20 might be deposited/formed in more than one step. By ways of example only, material 20 might comprise multi-resistive state metal oxide-compising material, further for example comprising two different layers or regions generally regarded as or understood to be active or passive regions, although not necessarily. Example active cell region compositions which comprise metal oxide and can be configured in multi-resistive states include one or a combination of $Sr_xRu_yO_z$, $Ru_xO_y$, and $In_xSn_yO_z$. Other examples include MgO, $Ta_2O_5$, $SrTiO_3$, $ZrO_x$ (perhaps doped with La), and $CaMnO_3$ (doped with one or more of Pr, La, Sr, or Sm). Example passive cell region compositions include one or a combination of $Al_2O_3$, $TiO_2$, and $HfO_2$. Regardless, material 20 might comprise additional metal oxide or other materials not comprising metal oxide. Example materials and constructions for a multi-resistive state region comprising one or more layers including a programmable metal oxide-comprising material are described and disclosed in U.S. Pat. Nos. 6,753,561; 7,149,108; 7,067,862; and 7,187,201, as well as in U.S. Patent Application Publication Nos. 2006/0171200 and 2007/0173019, the disclosures of which are hereby fully incorporated herein by reference for all purposes of this disclosure. Further as is conventional, multi-resistive state metal oxide-comprising materials encompass filament-type metal oxides, ferroelectric metal oxides and others, and whether existing or yet-to-be developed, as long as resistance of the metal oxide-comprising material can be selectively changed. Further, metal oxide-comprising material 20 might be configured to have its current leakage capabilities be selectively varied in addition to or instead of its resistive state.

Metal oxide-comprising material 20 can be considered as comprising sidewalls 23 within elongated trenches 18 and which define elongated trenches 24. In one embodiment, deposited material 16 may be fabricated to be of the same composition as that of metal oxide-comprising material 20.

Figure 9:
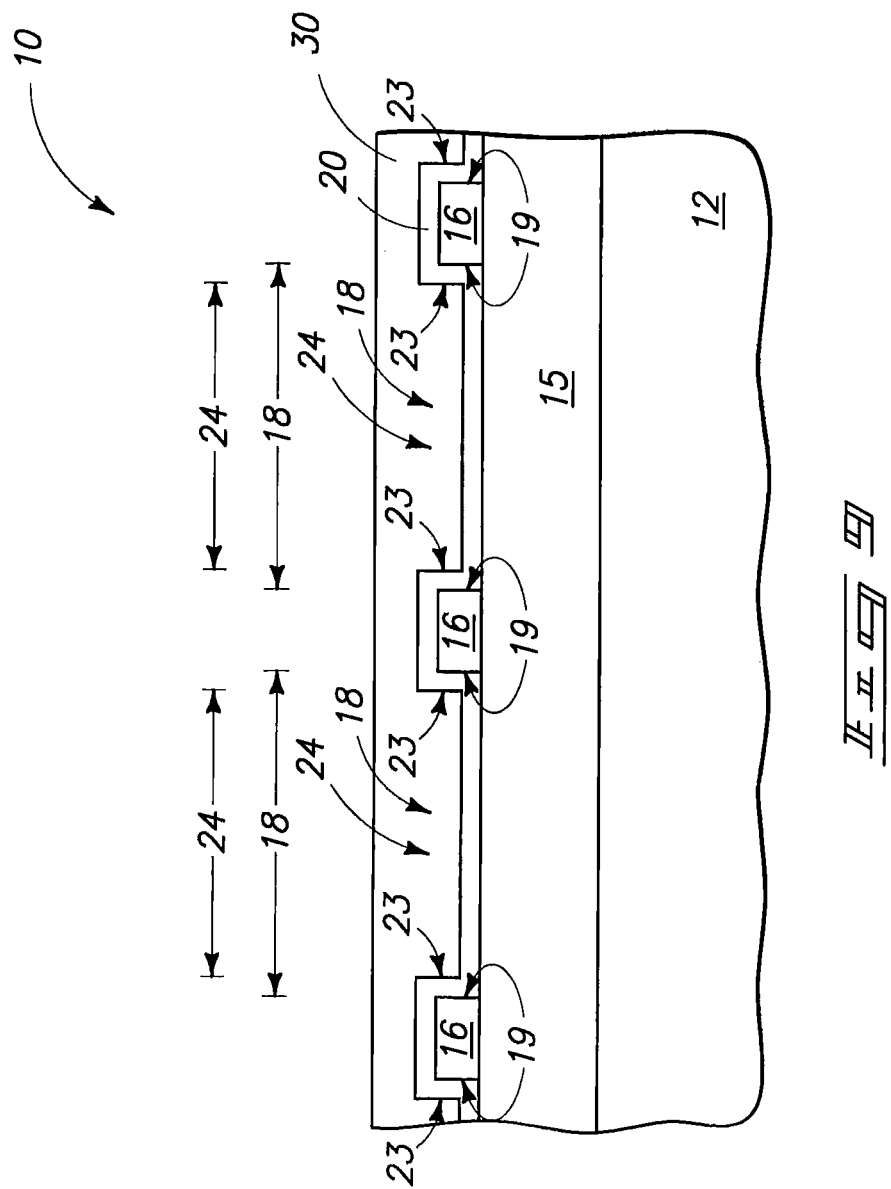
FIG. 9 is a view of the FIG. 8 substrate fragment at a processing step subsequent to that shown by FIG. 8.

A plurality of self-assembled block copolymer lines is formed within individual of trenches 24 in registered alignment with and between trench sidewalls 23. Any existing or yet-to-be developed manners of fabricating such lines are contemplated, as will be appreciated by the artisan. By way of examples only, FIG. 9 depicts deposition of block copolymer-comprising material 30 over or as part of substrate fragment 10. An example material includes polystyrene-block-poly(2-vinylpyridine) (PS-b-P2VP, MW=32,000/12,500), for example which can be spun coated onto a substrate using a 1% (w/w) toluene solution of polystyrene-block-poly(2-vinylpyridine). An example alternate material comprises polystyrene-b-poly(ethylene-alt-propylene). Block co-polymer material 30 may be entirely comprised of insulative material or may comprise one or a combination of conductive or semiconductive materials in addition to insulative material. For example, the PS-b-P2VP material might be combined with metal (meaning elemental metal, and one or more alloys of elemental metals, and/or conductive metal compounds) and/or semiconductive material (which may or may not be conductively doped).

Figure 10:
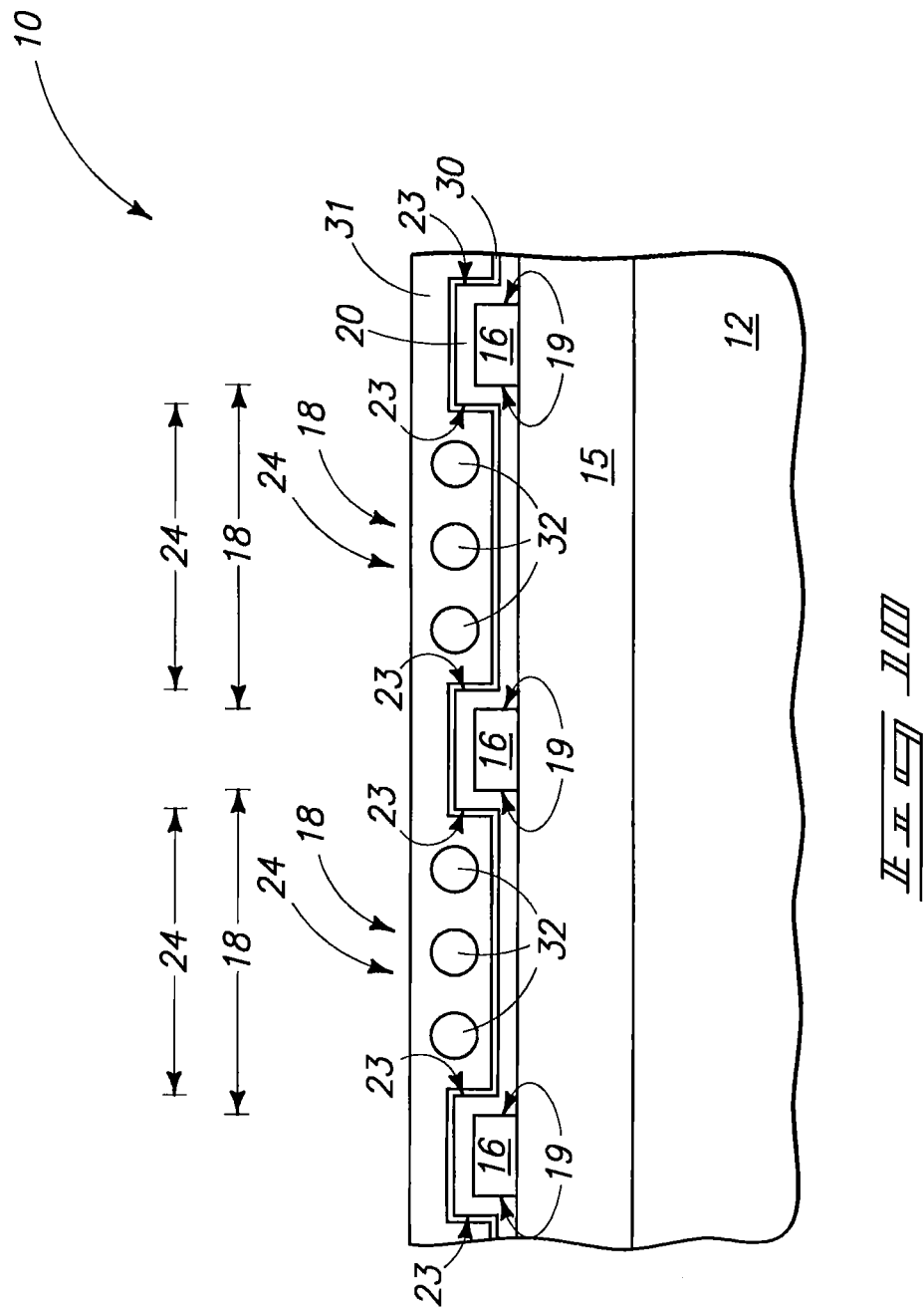
FIG. 10 is a view of the FIG. 9 substrate fragment at a processing step subsequent to that shown by FIG. 9.

Referring to FIG. 10, block copolymer-comprising material 30 has been annealed, thereby forming a plurality of self-assembled block copolymer lines 32 within individual of trenches 24 in registered alignment with and between trench sidewalls 23. For example, the above PS-b-P2VP-comprising material can be annealed at 230° C. for 24 hours at atmospheric or sub-atmospheric pressure to result in P2VP-comprising insulative cylinders/lines 32 surrounded by polystyrene 31 which may or may not be received over remnant of a P2VP layer 30. The block copolymer-comprising material of lines 32 may be insulative upon self-assembly into such lines, and regardless may comprise conductive material and insulative material upon such self-assembly. Further, block copolymer lines 32 may or may not upon self-assembly be void of conductive material. Regardless, a plurality of the other of conductive word lines or conductive bit lines is ultimately provided from the plurality of self-assembled block copolymer lines 32. In one embodiment where the self-assembled lines 32 comprise conductive and insulative material upon self-assembly, such might be conducted by removing all of the insulative material from such self-assembled block copolymer lines to leave the conductive material over the substrate, thereby forming the other of conductive word lines or conductive bit lines to be of the same essential orientation as self-assembled block copolymer lines 32. In another embodiment, provision of the other of conductive word lines or conductive bit lines may comprise replacing the self-assembled block copolymer lines 32 with conductive material.

Figure 11:
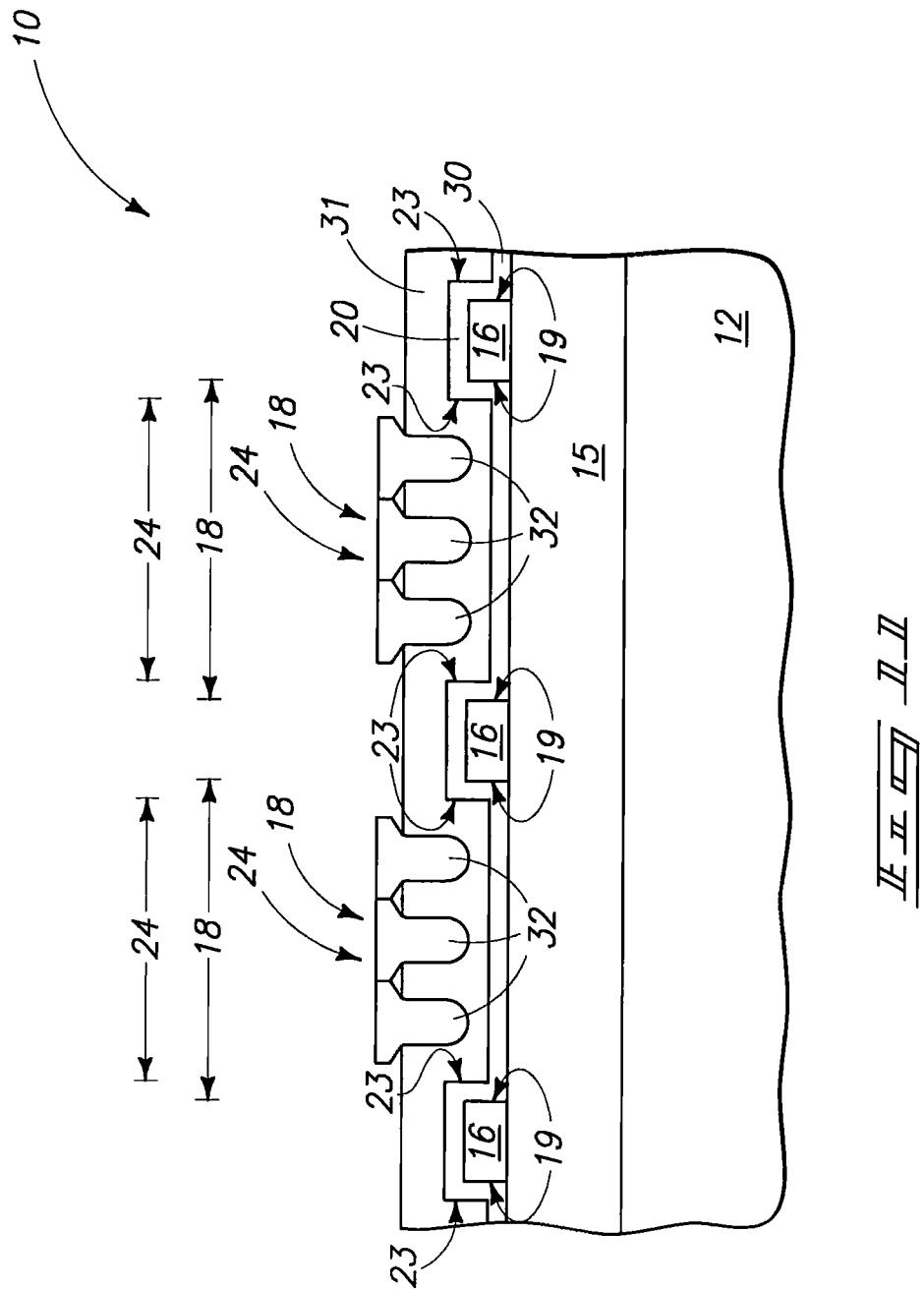
FIG. 11 is a view of the FIG. 10 substrate fragment at a processing step subsequent to that shown by FIG. 10.
Figure 12:
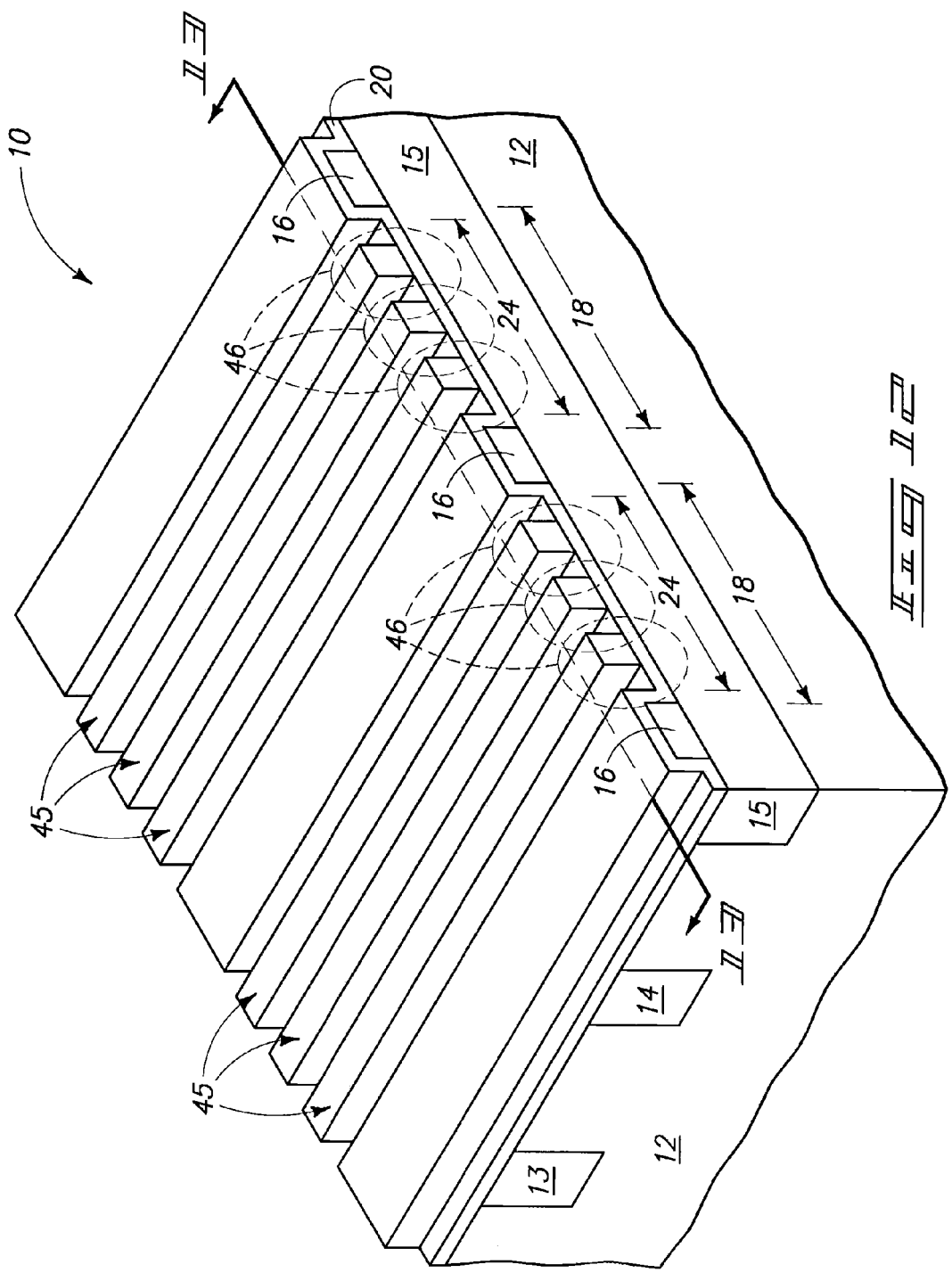
FIG. 12 is a diagrammatic isometric view of the FIG. 11 substrate fragment at a processing step subsequent to that shown by FIG. 11.

For example and by way of example only, referring to FIG. 11, the substrate of FIG. 10 has been soaked for 10 minutes in dilute HF (i.e., aq., 0.9 wt %) or HCl (i.e., aq., 0.9 wt %) at ambient temperature and pressure in the presence of the anionic square planar compound ion $[AuCl_4]^-$, for example derived from 10 mM $HAuCl_4$ (aq.) or $KAuCl_4$ (aq.). The acid solution exposure may result in rapid formation of the depicted mushroom structures 32 resulting from protonation and swelling of the P2VP material, which can pierce and penetrate the overlying polystyrene layer, making contact with the aqueous solution. The protonated P2VP block of the Ps-b-P2VP may carry a net positive charge, and which can be loaded by anionic metallic complexes (i.e., $MCl_4^-$) in solution by electrostatic attraction. This can be followed by a 30 s oxygen plasma treatment, which results in removal of the insulative polymer which is substituted by gold or other metal (M) deposition (for example any one or more of Ru, Pt, Ir, Pd, W, Ti, and Cu) in its place from the metallic complexes, thereby forming the other of conductive word lines 45 or conductive bit lines 45 for example as shown in FIGS. 12 and 13. Accordingly, conductive word lines 45 or conductive bit lines 45 have been formed/provided from the plurality of self-assembled block copolymer lines 32, with the depicted example FIGS. 11-13 embodiment showing such by replacing self-assembled block copolymer material of lines 32 with conductive material. Further by ways of example only, similar results can be obtained with palladium and platinum using the respective anionic square complexes $Na_2[PdCl_4]$ and $Na_2[PtCl_4]$. Alternately if copolymer lines comprise both metal and P2VP material upon self assembly, the stated example oxygen plasma treatment can result in the depicted metal line 45 formation. Additional example metals (M) include one or more of ruthenium, iridium, tungsten, titanium, and copper. Alternate existing or yet-to-be developed block copolymer techniques might also of course be utilized.

Regardless, individually programmable junctions are formed which comprise the metal oxide-comprising material 20 where the word lines and bit lines cross one another, thereby forming example individual memory cells 46. Some of block copolymer-comprising material 30/32 (not shown/present in FIGS. 12 and 13) may or may not remain as part of the other of conductive word lines 45 or conductive bit lines 45 in a finished circuitry construction incorporating the depicted memory array.

Conductive word lines 45 or conductive bit lines 45 might be processed subsequently to change size and/or shape. For example, tops and/or sidewalls of conductive lines 45 may be etched after fabrication. Additionally and/or alternately by way of example only, conductor material may be deposited onto the conductive material from which lines 45 are fabricated, for example by atomic layer deposition or other deposition techniques. Additionally or alternately by way of example only, metal (meaning elemental metal, and one or more alloys of elemental metals, and/or conductive metal compounds) may be selectively electroplated onto the conductive material from which lines 45 are fabricated after their formation as described above.

The substrate of FIGS. 12 and 13 would likely be subsequently processed to deposit insulative and wiring layers (not shown as not being material to the inventions disclosed herein) in a finished circuitry construction. In one embodiment, a method of forming a non-volatile resistive oxide memory array as disclosed herein through the point of fabricating finished circuitry construction is void of exposing the metal oxide-comprising material to any etching plasma, for example to avoid the problems identified in the "Background" section above. Alternately, such might be exposed to etching plasma, whether proximate conductive lines 45 or spaced therefrom. Further, all remnant of deposited material 16 after formation of conductive lines 45 can be removed (not shown) such that none of deposited material 16 remains as part of a finished circuitry construction incorporating the memory array. Alternately, some of such deposited material 16 may remain as part of such finished circuitry construction.

Figure 14:
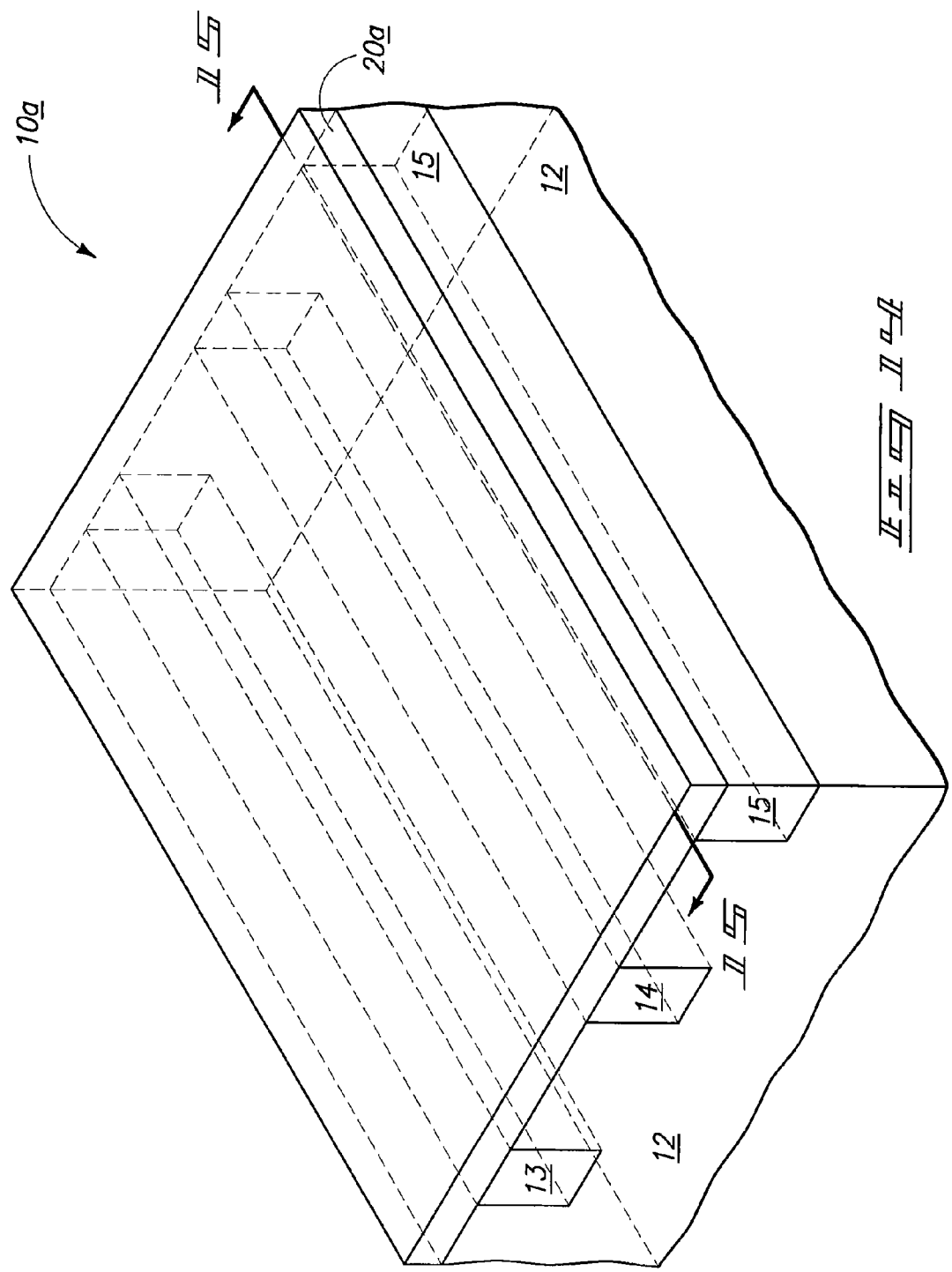
FIG. 14 is a diagrammatic isometric view of another embodiment semiconductor substrate fragment in process in accordance with an embodiment of the invention.
Figure 15:
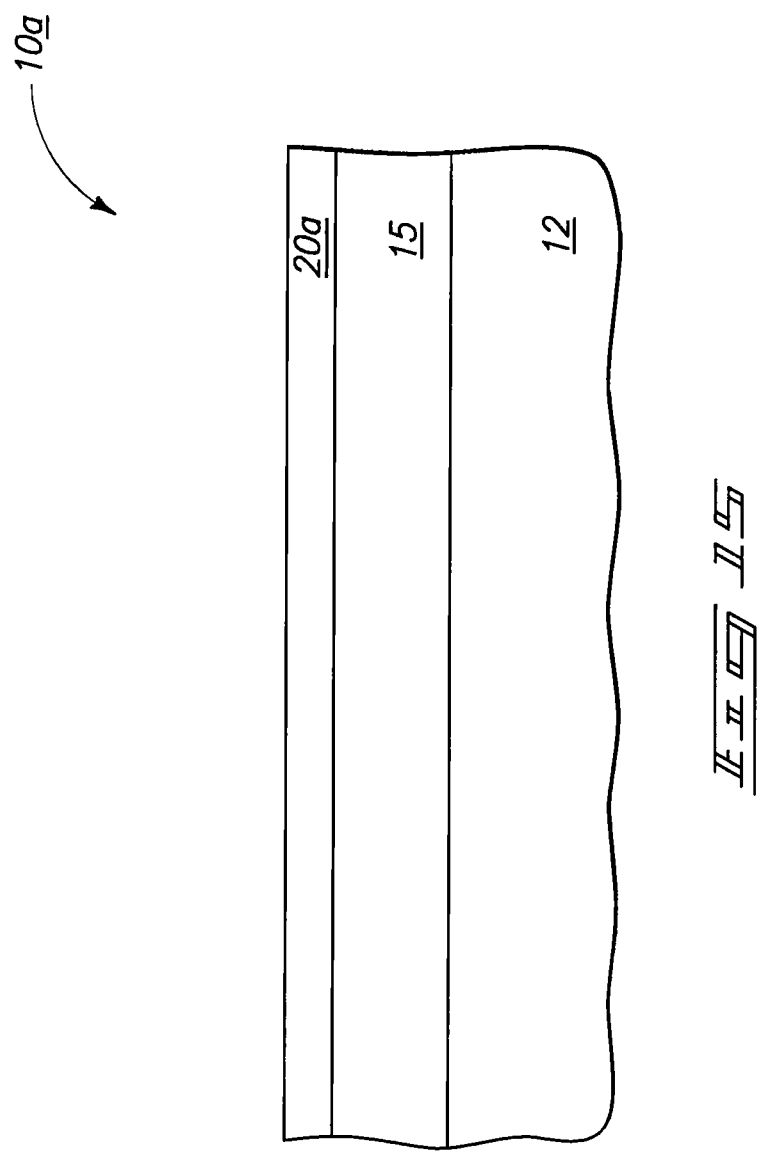
FIG. 15 is a cross sectional view of the FIG. 14 substrate fragment comprising a planar cross section taken through line 15-15 in FIG. 14.

Other example embodiments are next described with reference to FIGS. 14-22 in connection with a substrate fragment 10*a*. Like numerals from the first described embodiment have been utilized where appropriate, with differences being indicated with the suffix "a" or with different numerals. Referring to FIGS. 14 and 15, metal oxide-comprising material 20*a* has been formed over the plurality of one of word lines 13, 14, 15 or bit lines 13, 14, 15. Example materials for metal oxide-comprising material 20*a* are the same as those described above for material 20. In the depicted example embodiment, metal oxide-comprising material 20*a* is formed to have a planar outer surface within the array, although such is of course not required.

Figure 17:
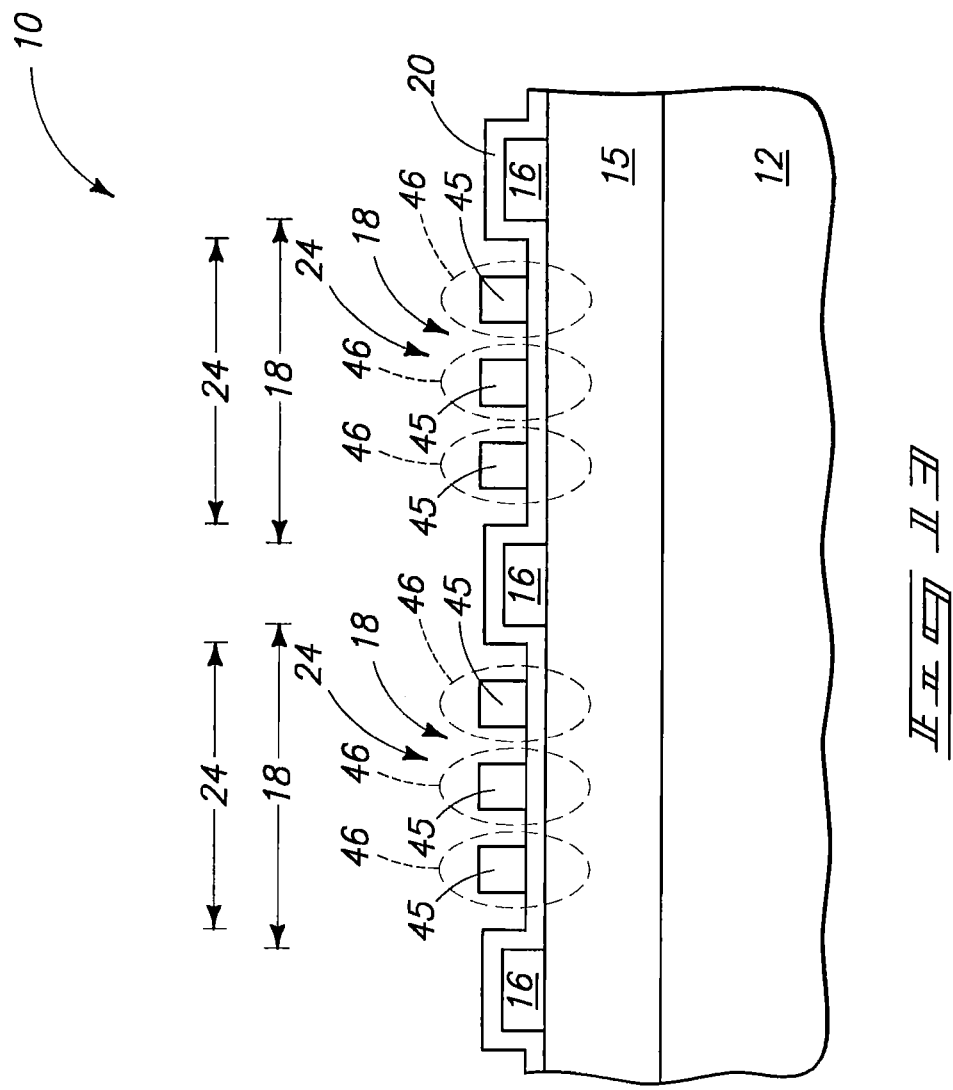
FIG. 17 is a cross sectional view of the FIG. 16 substrate fragment comprising a planar cross section taken through line 17-17 in FIG. 16.
Figure 16:
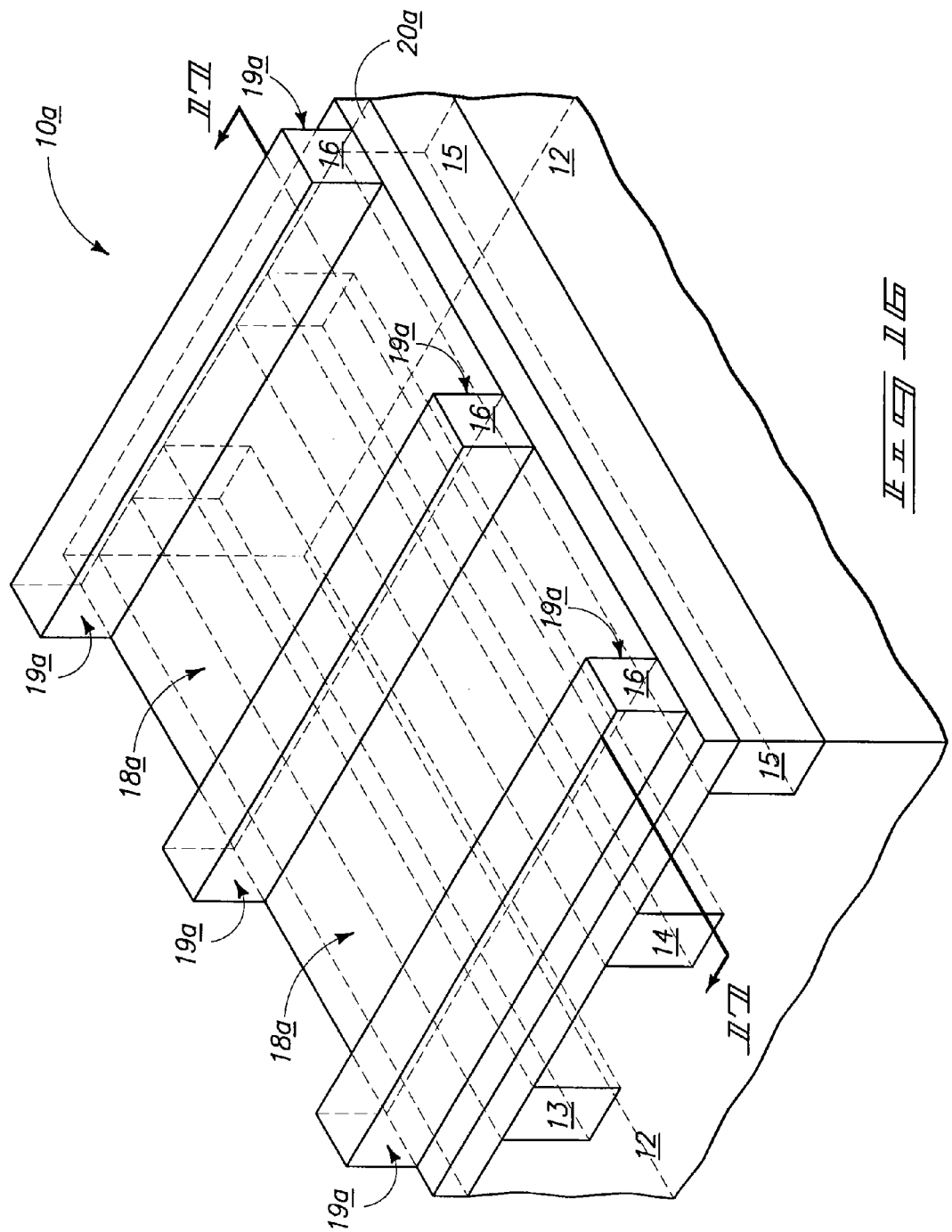
FIG. 16 is a view of the FIG. 14 substrate fragment at a processing step subsequent to that shown by FIG. 14.
Figure 17:
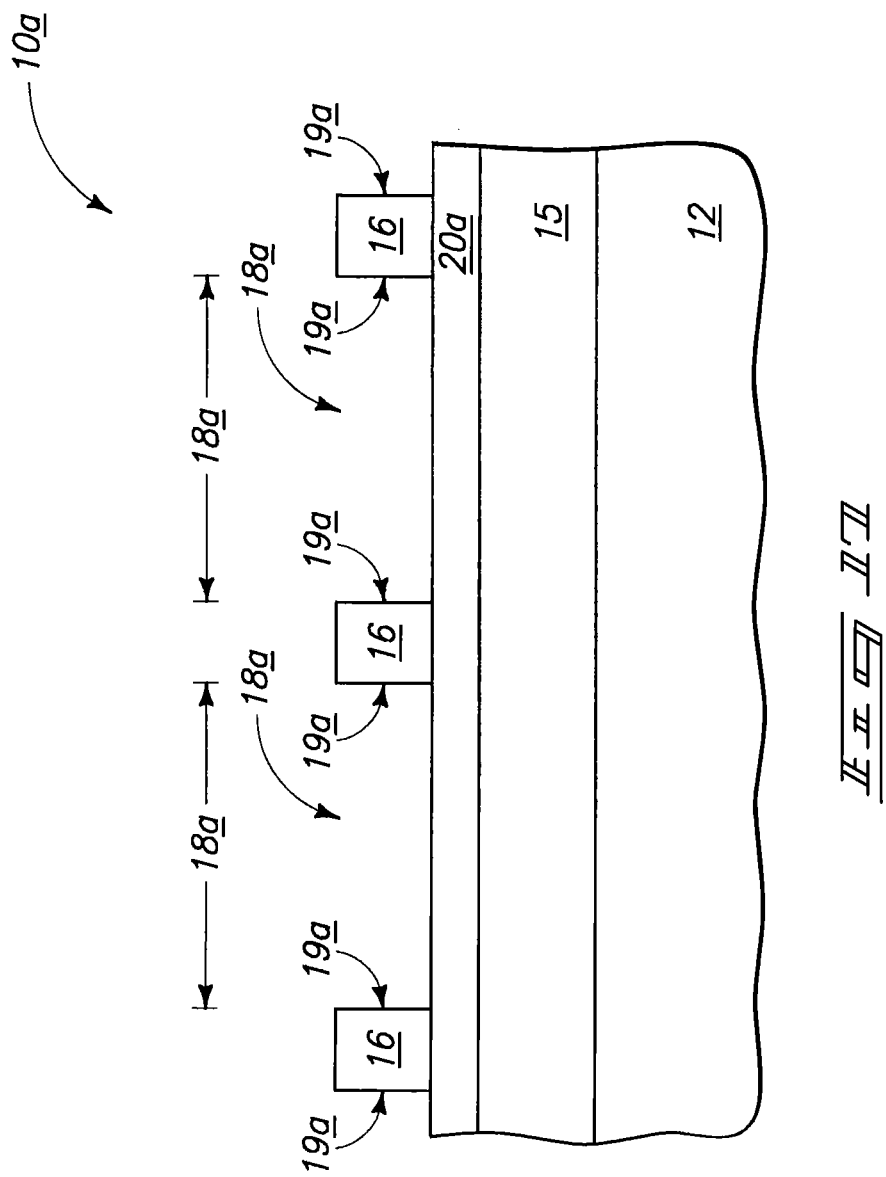
Figure 18B:
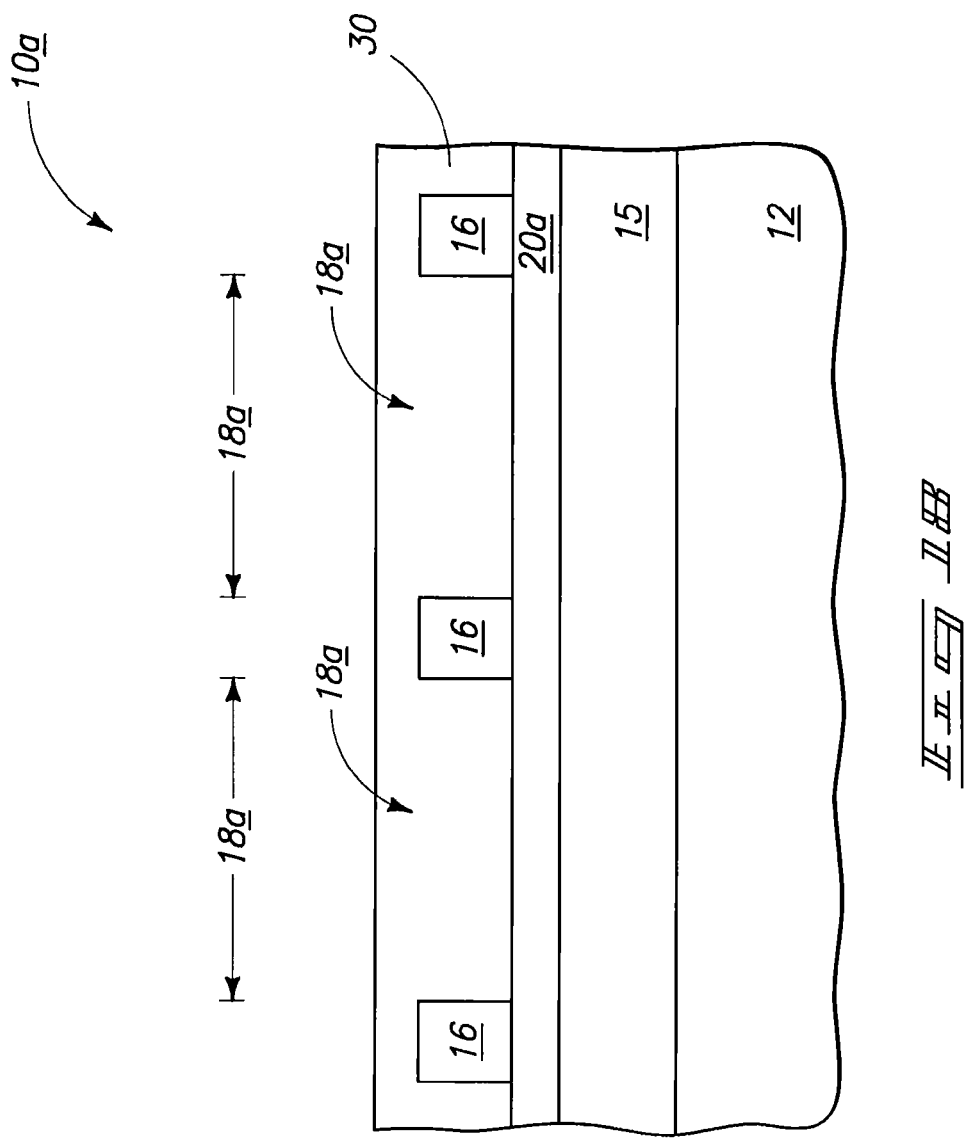
FIG. 18 is a view of the FIG. 17 substrate fragment at a processing step subsequent to that shown by FIG. 17.
Figure 19:
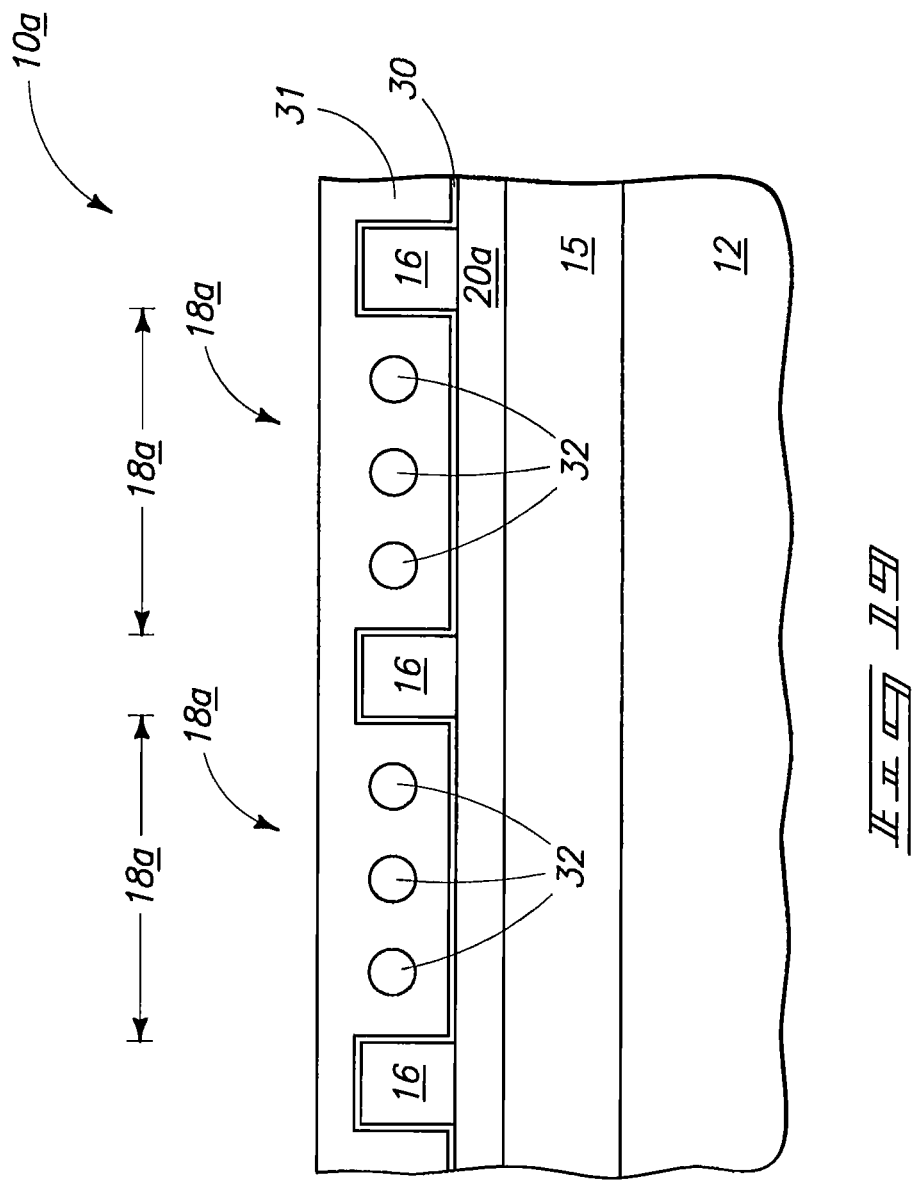
FIG. 19 is a view of the FIG. 18 substrate fragment at a processing step subsequent to that shown by FIG. 18.
Figure 20:
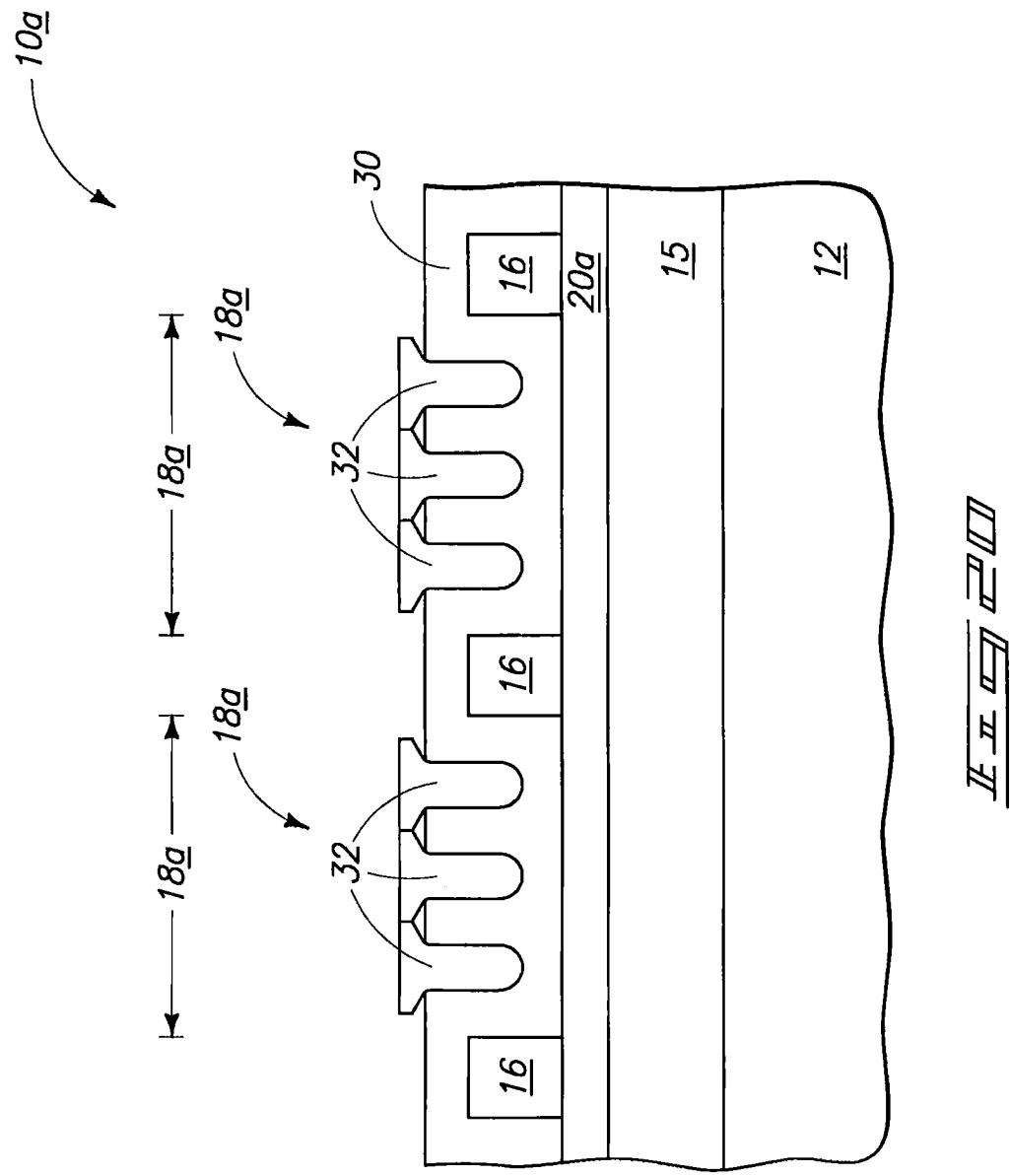
FIG. 20 is a view of the FIG. 19 substrate fragment at a processing step subsequent to that shown by FIG. 19.
Figure 21:
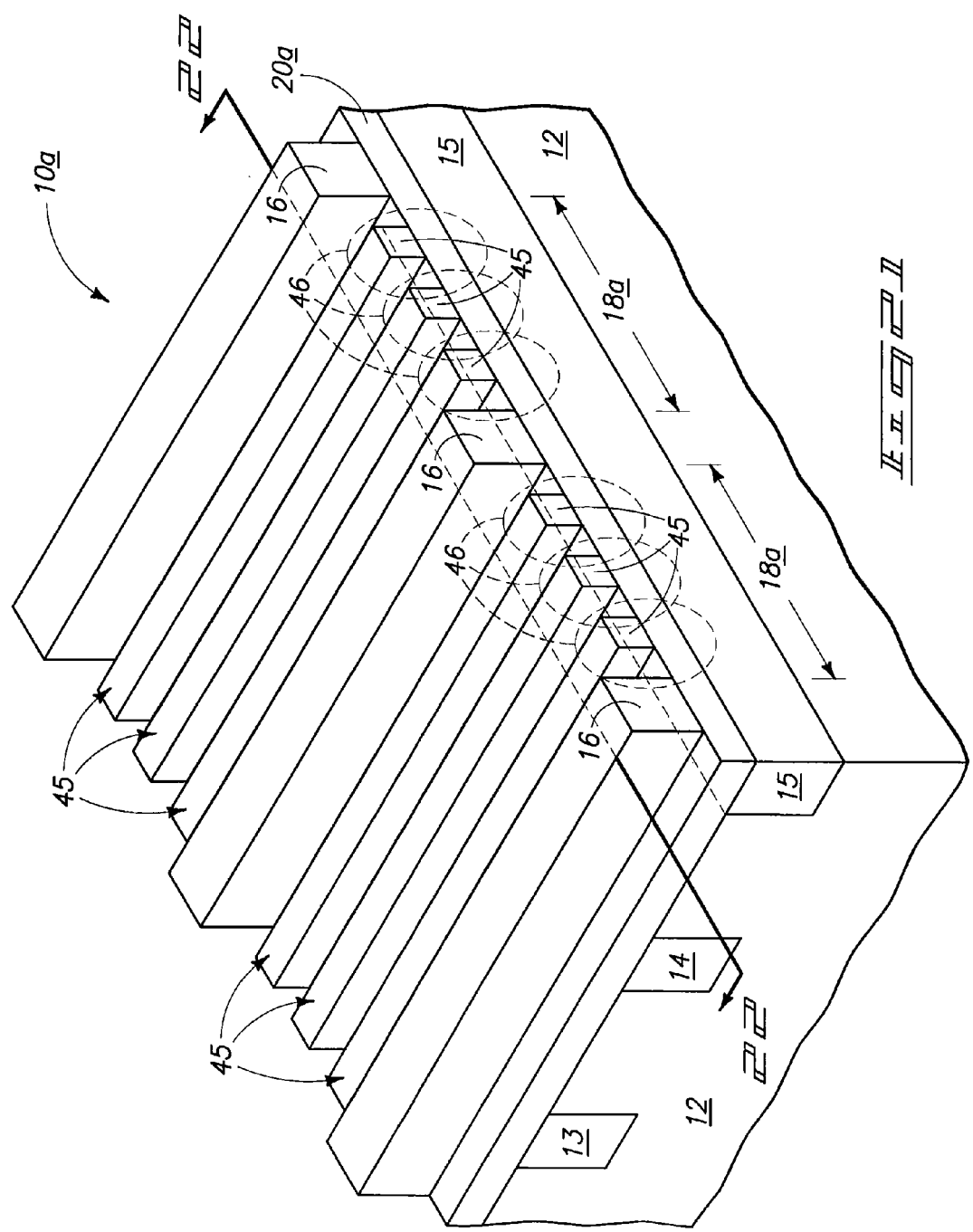
FIG. 21 is a diagrammatic isometric view of the FIG. 20 substrate fragment at a processing step subsequent to that shown by FIG. 20.

Referring to FIGS. 16 and 17, material 16 has been deposited over metal oxide-comprising material 20*a*, with a series of elongated trenches 18*a* having been formed therethrough to extend to metal oxide-comprising material 20*a*. Manners of fabrication include any of those as described above with respect to deposited material 16. In one example embodiment, material 16 comprises photoresist which is removed after forming the other of conductive word lines 45 or bit lines 45 (not present in FIGS. 16 and 17). Trenches 18*a* may be of the same or different dimensions as that of trenches 18 or 24 in the first-described FIGS. 1-12 embodiments.

A plurality of self-assembled block copolymer lines is formed within individual of the trenches in registered alignment with and between the trench sidewalls. A plurality of the other of conductive word lines or conductive bit lines is provided from such plurality of self-assembled block copolymer lines. FIGS. 18-22 depict such example processing analogous to that described above with respect to FIGS. 9-13, by way of examples only. Such thereby forms individually programmable junctions comprising the metal oxide-comprising material 20*a* where the word lines and bit lines cross one another, for example to form the depicted memory cells 46. Processing and materials can otherwise be as described above with, for example, perhaps deposited material 16 remaining as part of the finished circuitry construction, or being entirely removed from the substrate.

Some embodiments of a method of forming a non-volatile resistive oxide memory array include forming a plurality of one of conductive word lines or conductive bit lines over a substrate. Metal oxide-comprising material is formed over the plurality of the one of the word lines or bit lines. A series of elongated trenches is provided over the plurality of the one of the word lines or bit lines, with such running generally parallel an outer major surface of the substrate and being angled relative to the plurality of the one of the word lines or bit lines. The elongated trenches will respectively comprise sidewalls. For example in the FIGS. 1-13 embodiment, trenches 24 comprise sidewalls 23 and which are comprised of metal oxide-comprising material 20. Such have been formed, in one example, by depositing a layer comprising the metal oxide-comprising material within trenches 18 formed with a material 16 which overlies the one of word lines 13, 14, 15 or bit lines 13, 14, 15. By way of examples only, the embodiments of FIGS. 14-22 depict alternate examples wherein elongated trenches 18*a* comprise sidewalls 19*a* which do not comprise metal oxide-comprising material 20*a*.

Regardless, a plurality of self-assembled block copolymer lines is formed within individual of the trenches in registered alignment with and between the trench sidewalls. A plurality of the other of the conductive word lines or bit lines is ultimately provided from such plurality of self-assembled block copolymer lines, for example as described above. Ultimately, individually programmable junctions are formed which comprise the metal oxide-comprising material where the word lines and bit lines cross one another.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a non-volatile memory array, comprising:

forming a plurality of one of conductive word lines or conductive bit lines over a substrate;

forming programmable multi-resistive state material over the plurality of said one of the word lines or bit lines;

providing a series of elongated trenches over the plurality of said one of the word lines or bit lines, the elongated trenches running generally parallel an outer major surface of the substrate, the trenches being angled relative to the plurality of said one of the word lines or bit lines, the elongated trenches respectively comprising sidewalls;

forming a plurality of self-assembled block copolymer lines within individual of the trenches in registered alignment with and between the trench sidewalls; and providing a plurality of the other of conductive word lines or conductive bit lines from said plurality of self-assembled block copolymer lines to form individually programmable junctions comprising said programmable multi-resistive state material where the word lines and bit lines cross one another.

2. The method of claim 1 wherein,
the forming of the block copolymer lines comprises annealing block copolymer-comprising material, the block copolymer-comprising material comprising conductive material and insulative material upon self-assembly into said block copolymer lines from such annealing; and
the providing of said other of the conductive word lines or conductive bit lines comprising removing the insulative material from such self-assembled block copolymer lines to leave the conductive material.

3. The method of claim 2 wherein the block copolymer lines upon self-assembly are insulative prior to said removing.

4. The method of claim 2 wherein the removing is of all the insulative material.

5. The method of claim 2 comprising selectively electroplating metal onto the conductive material after said removing.

6. The method of claim 2 comprising depositing conductor material onto the conductive material after said removing.

7. The method of claim 2 comprising etching the conductive material after said removing.

8. The method of claim 1 wherein,
the forming of the block copolymer lines comprises annealing block copolymer-comprising material, the block copolymer-comprising material being insulative upon self-assembly into said block copolymer lines from such annealing; and
the providing of said other of the conductive word lines or conductive bit lines comprising replacing said the self-assembled block copolymer lines with conductive material.

9. The method of claim 8 wherein the block copolymer lines upon self-assembly are void of conductive material.

10. The method of claim 8 comprising selectively electroplating metal onto the conductive material after said replacing.

11. The method of claim 8 comprising depositing conductor material onto the conductive material after said replacing.

12. The method of claim 8 comprising etching the conductive material after said replacing.

13. The method of claim 1 wherein forming of the block copolymer lines comprises annealing block copolymer-comprising material, none of the block copolymer-comprising material remaining as part of said other of the conductive word lines or conductive bit lines in a finished circuitry construction incorporating said memory array.

14. A method of forming a non-volatile memory array, comprising:
forming a plurality of one of conductive word lines or conductive bit lines over a substrate;
forming a series of elongated trenches with a deposited material received over the plurality of said one of the word lines or bit lines, the elongated trenches running generally parallel an outer major surface of the substrate, the trenches being angled relative to the plurality of said one of the word lines or bit lines;
forming programmable multi-resistive state material within and to less than completely fill the trenches and over the plurality of said one of the word lines or bit lines, the programmable multi-resistive state material comprising sidewalls within the trenches;
forming a plurality of self-assembled block copolymer lines within individual of the trenches in registered alignment with and between the trench sidewalls; and
providing a plurality of the other of conductive word lines or conductive bit lines from said plurality of self-assembled block copolymer lines to form individually programmable junctions comprising said programmable multi-resistive state material where the word lines and bit lines cross one another.

15. The method of claim 14 wherein some of said deposited material remains in a finished circuitry construction incorporating said memory array.

16. The method of claim 14 comprising removing all remnant of said deposited material after said providing such that none of said deposited material remains as part of a finished circuitry construction incorporating said memory array.

17. The method of claim 14 wherein,
the forming of the block copolymer lines comprises annealing block copolymer-comprising material, the block copolymer-comprising material comprising conductive material and insulative material upon self-assembly into said block copolymer lines from such annealing; and
the providing of said other of the conductive word lines or conductive bit lines comprising removing the insulative material from such self-assembled block copolymer lines to leave the conductive material.

18. The method of claim 14 wherein,
the forming of the block copolymer lines comprises annealing block copolymer-comprising material, the block copolymer-comprising material being insulative upon self-assembly into said block copolymer lines from such annealing; and
the providing of said other of the conductive word lines or conductive bit lines comprising replacing said the self-assembled block copolymer lines with conductive material.

19. A method of forming a non-volatile memory array, comprising:
forming a plurality of one of conductive word lines or conductive bit lines over a substrate;
forming programmable multi-resistive state material over the plurality of said one of the word lines or bit lines;
forming a series of elongated trenches through a deposited material received over the programmable multi-resistive state material, the elongated trenches running generally parallel an outer major surface of the substrate and extending to the programmable multi-resistive state material, the trenches being angled relative to the plurality of said one of the word lines or bit lines, the elongated trenches respectively comprising sidewalls;
forming a plurality of self-assembled block copolymer lines within individual of the trenches in registered alignment with and between the trench sidewalls; and
providing a plurality of the other of conductive word lines or conductive bit lines from said plurality of self-assembled block copolymer lines to form individually programmable junctions comprising said programmable multi-resistive state material where the word lines and bit lines cross one another.

20. The method of claim 19 wherein,
the forming of the block copolymer lines comprises annealing block copolymer-comprising material, the block copolymer-comprising material comprising conductive material and insulative material upon self-assembly into said block copolymer lines from such annealing; and the providing of said other of the conductive word lines or conductive bit lines comprising removing the insulative material from such self-assembled block copolymer lines to leave the conductive material.

21. The method of claim 19 wherein,
the forming of the block copolymer lines comprises annealing block copolymer-comprising material, the block copolymer-comprising material being insulative upon self-assembly into said block copolymer lines from such annealing; and
the providing of said other of the conductive word lines or conductive bit lines comprising replacing said the self-assembled block copolymer lines with conductive material.

22. A method of forming a non-volatile memory array, comprising:
forming a plurality of one of conductive word lines or conductive bit lines over a substrate;
forming programmable multi-resistive state material over the plurality of said one of the word lines or bit lines;
forming a plurality of self-assembled block copolymer lines which angle relative to the plurality of said one of the word lines or bit lines; and
providing a plurality of the other of conductive word lines or conductive bit lines from said plurality of self-assembled block copolymer lines to form individually programmable junctions comprising said programmable multi-resistive state material where the word lines and bit lines cross one another.

23. The method of claim 22 wherein,
the forming of the block copolymer lines comprises annealing block copolymer-comprising material, the block copolymer-comprising material comprising conductive material and insulative material upon self-assembly into said block copolymer lines from such annealing; and
the providing of said other of the conductive word lines or conductive bit lines comprising removing the insulative material from such self-assembled block copolymer lines to leave the conductive material.

24. The method of claim 23 wherein the block copolymer lines upon self-assembly are insulative prior to said removing.

25. The method of claim 23 wherein the removing is of all the insulative material.

26. The method of claim 23 comprising selectively electroplating metal onto the conductive material after said removing.

27. The method of claim 23 comprising depositing conductor material onto the conductive material after said removing.

28. The method of claim 23 comprising etching the conductive material after said removing.

29. The method of claim 22 wherein,
the forming of the block copolymer lines comprises annealing block copolymer-comprising material, the block copolymer-comprising material being insulative upon self-assembly into said block copolymer lines from such annealing; and
the providing of said other of the conductive word lines or conductive bit lines comprising replacing said the self-assembled block copolymer lines with conductive material.

30. The method of claim 29 wherein the block copolymer lines upon self-assembly are void of conductive material.

31. The method of claim 29 comprising selectively electroplating metal onto the conductive material after said replacing.

32. The method of claim 29 comprising depositing conductor material onto the conductive material after said replacing.

33. The method of claim 29 comprising etching the conductive material after said replacing.

34. The method of claim 22 wherein the forming of the block copolymer lines comprises annealing block copolymer-comprising material to form upwardly projecting structures which are mushroom-shaped in cross-section.

35. The method of claim 22 wherein the forming of the block copolymer lines comprises annealing block copolymer-comprising material which remains as part of a finished circuitry construction incorporating said memory array.

36. The method of claim 22 wherein the forming of the block copolymer lines comprises annealing block copolymer-comprising material, and further comprising removing the annealed block copolymer-comprising material so that none of it remains as part of a finished circuitry construction incorporating said memory array.

* * * * *